(12) United States Patent
Dong et al.

(10) Patent No.: US 7,995,394 B2
(45) Date of Patent: Aug. 9, 2011

(54) PROGRAM VOLTAGE COMPENSATION WITH WORD LINE BIAS CHANGE TO SUPPRESS CHARGE TRAPPING IN MEMORY

(75) Inventors: Yingda Dong, San Jose, CA (US); Toru Ishigaki, Yokohama (JP); Ken Oowada, Kanagawa (JP)

(73) Assignee: SanDisk Technologies Inc., Plano, TX (US)

( * ) Notice: Subject to any disclaimer, the term of this patent is extended or adjusted under 35 U.S.C. 154(b) by 240 days.

(21) Appl. No.: 12/512,181

(22) Filed: Jul. 30, 2009

(65) Prior Publication Data

US 2011/0026331 A1   Feb. 3, 2011

(51) Int. Cl.
*G11C 11/34* (2006.01)
(52) U.S. Cl. ......... 365/185.19; 365/185.03; 365/185.18; 365/189.09; 365/207
(58) Field of Classification Search .............. 365/185.03, 365/185.18, 185.19, 189.09, 207
See application file for complete search history.

(56) References Cited

U.S. PATENT DOCUMENTS

| | | | |
|---|---|---|---|
| 5,642,309 A | 6/1997 | Kim | |
| 7,212,435 B2 | 5/2007 | Rudeck | |
| 7,426,138 B1 | 9/2008 | Wong | |
| 7,440,323 B2 | 10/2008 | Lutze | |
| 7,545,680 B2 | 6/2009 | Kim | |
| 2005/0030828 A1 | 2/2005 | Tanaka | |
| 2005/0083735 A1 | 4/2005 | Chen | |
| 2005/0122780 A1* | 6/2005 | Chen et al. | 365/185.17 |
| 2006/0126390 A1* | 6/2006 | Gorobets et al. | 365/185.22 |
| 2008/0008006 A1 | 1/2008 | Goda | |
| 2008/0037327 A1 | 2/2008 | Park | |
| 2008/0084752 A1 | 4/2008 | Li | |
| 2008/0101126 A1 | 5/2008 | Hemink | |
| 2008/0123426 A1 | 5/2008 | Lutze | |
| 2008/0225595 A1 | 9/2008 | Choi | |
| 2008/0259689 A1* | 10/2008 | Roohparvar | 365/185.17 |
| 2008/0283899 A1 | 11/2008 | Hendriks | |
| 2008/0291730 A1 | 11/2008 | Aritome | |
| 2009/0040831 A1 | 2/2009 | Noh | |
| 2009/0141557 A1 | 6/2009 | Fujiu | |

* cited by examiner

*Primary Examiner* — Pho M Luu
*Assistant Examiner* — Thao Bui
(74) *Attorney, Agent, or Firm* — Vierra Magen Marcus & DeNiro LLP

(57) ABSTRACT

Program disturb is reduced in a non-volatile storage system during a program operation for a selected word line by initially using a pass voltage with a lower amplitude on word lines which are adjacent to the selected word line. This helps reduce charge trapping at floating gate edges, which can widen threshold voltage distributions with increasing program-erase cycles. When program pulses of higher amplitude are applied to the selected word line, the pass voltage switches to a higher level to provide a sufficient amount of channel boosting. The switch to a higher pass voltage can be triggered by a specified program pulse being applied or by tracking lower state storage elements until they reach a target verify level. The amplitude of the program voltage steps down when the pass voltage steps up, to cancel out capacitive coupling to the selected storage elements from the change in the pass voltage.

20 Claims, 15 Drawing Sheets

U.S. 7,995,394 B2

PROGRAM VOLTAGE COMPENSATION WITH WORD LINE BIAS CHANGE TO SUPPRESS CHARGE TRAPPING IN MEMORY

BACKGROUND

The present technology relates to non-volatile memory.

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM.

Both the traditional EEPROM and the flash memory utilize a floating gate that is positioned above and insulated from a channel region in a semiconductor substrate. The floating gate is positioned between the source and drain regions. A control gate is provided over and insulated from the floating gate. The threshold voltage (Vth) of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate.

Some EEPROM and flash memory devices have a storage element or cell with a floating gate that is used to store two ranges of charges and, therefore, the storage element can be programmed/erased between two states, e.g., an erased state and a programmed state. Such a flash memory device is sometimes referred to as a binary flash memory device because each storage element can store one bit of data.

A multi-state (also called multi-level) flash memory device is implemented by identifying multiple distinct allowed/valid programmed threshold voltage ranges. Each distinct threshold voltage range corresponds to a predetermined value for the set of data bits encoded in the memory device. For example, each storage element can store two bits of data when the element can be placed in one of four discrete charge bands corresponding to four distinct threshold voltage ranges.

Typically, a program voltage Vpgm applied to the control gate during a program operation is applied as a series of pulses that increase in magnitude over time. The program voltage can be applied to a selected word line. In one possible approach, the magnitude of the pulses is increased with each successive pulse by a predetermined step size, e.g., 0.2-0.4 V. Vpgm can be applied to the control gates of flash memory elements. In the periods between the program pulses, verify operations are carried out. That is, the programming level of each element of a group of storage elements being programmed in parallel is read between successive program pulses to determine whether it is equal to or greater than a verify level to which the element is being programmed. For arrays of multi-state flash memory elements, a verification step may be performed for each state of an element to determine whether the element has reached its data-associated verify level. For example, a multi-state memory element capable of storing data in four states may need to perform verify operations for three compare points.

Moreover, when programming an EEPROM or flash memory device, such as a NAND flash memory device in a NAND string, typically Vpgm is applied to the control gate and the bit line is grounded, causing electrons from the channel of a storage element to be injected into the floating gate. When electrons accumulate in the floating gate, the floating gate becomes negatively charged and the threshold voltage of the storage element is raised so that it is considered to be in a programmed state.

However, one issue which continues to be problematic is program disturb. Program disturb can occur at inhibited, unselected NAND strings during programming of other, selected NAND strings. Program disturb occurs when the threshold voltage of an unselected non-volatile storage element is shifted due to programming of other non-volatile storage elements. Program disturb can occur on previously programmed storage elements as well as erased storage elements that have not yet been programmed. Additionally, performance often degrades as a memory device experiences an increasing number of program-erase cycles.

DETAILED DESCRIPTION

A method and non-volatile storage system are provided in which program disturb and degradation with program-erase cycles is reduced by optimally setting pass voltages on unselected word lines.

A program operation initially uses a pass voltage with a lower amplitude on word lines which are adjacent to a selected word line. The use of a lower amplitude is helpful in reducing degradation with program-erase cycles by reducing charge trapping at floating gate edges. This helps reduce widening of threshold voltage distributions. Moreover, the lower channel boosting which results from a lower pass voltage is acceptable when the program pulses are relatively low in amplitude. Later in the program operation, when program pulses of higher amplitude are applied to the selected word line, the pass voltage switches to a higher level to provide a sufficient amount of channel boosting. The switch to a higher pass voltage can be triggered by a specified program pulse being applied or by tracking lower state storage elements until they reach their target verify level. Furthermore, the amplitude of the program voltage steps down when the pass voltage steps up, to cancel out capacitive coupling to the selected storage elements from the change in the pass voltage.

Figure 1A:
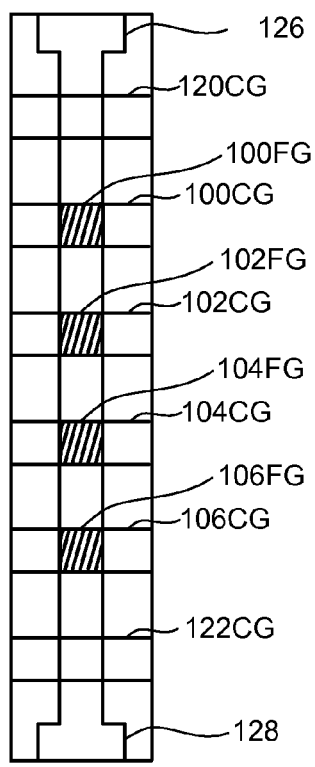
FIG. 1a is a top view of a NAND string.
Figure 1B:
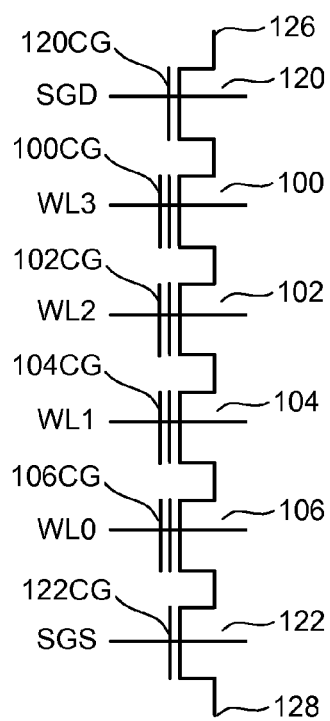
FIG. 1b is an equivalent circuit diagram of the NAND string.

One example of a suitable memory system uses the NAND flash memory structure, which arranges multiple transistors in series between two select gates. The transistors in series and the select gates are referred to as a NAND string. FIG. 1a is a top view showing one NAND string. FIG. 1b is an equivalent circuit thereof. The NAND string depicted includes four transistors, 100, 102, 104 and 106, in series and sandwiched between a first select gate 120 and a second select gate 122. Select gate 120 connects the NAND string to bit line 126. Select gate 122 connects the NAND string to source line 128. Select gate 120 is controlled by applying the appropriate voltages to control gate 120CG. Select gate 122 is controlled by applying the appropriate voltages to control gate 122CG. Each of the transistors 100, 102, 104 and 106 has a control gate and a floating gate. Transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gate 100CG is connected to word line WL3, control gate 102CG is connected to word line WL2, control gate 104CG is connected to word line WL1, and control gate 106CG is connected to word line WL0. In one embodiment, transistors 100, 102, 104 and 106 are each memory cells. In other embodiments, the memory cells may include multiple transistors or may be different than that depicted. Select gate 120 is connected to select line SGD. Select gate 122 is connected to select line SGS.

Figure 2:
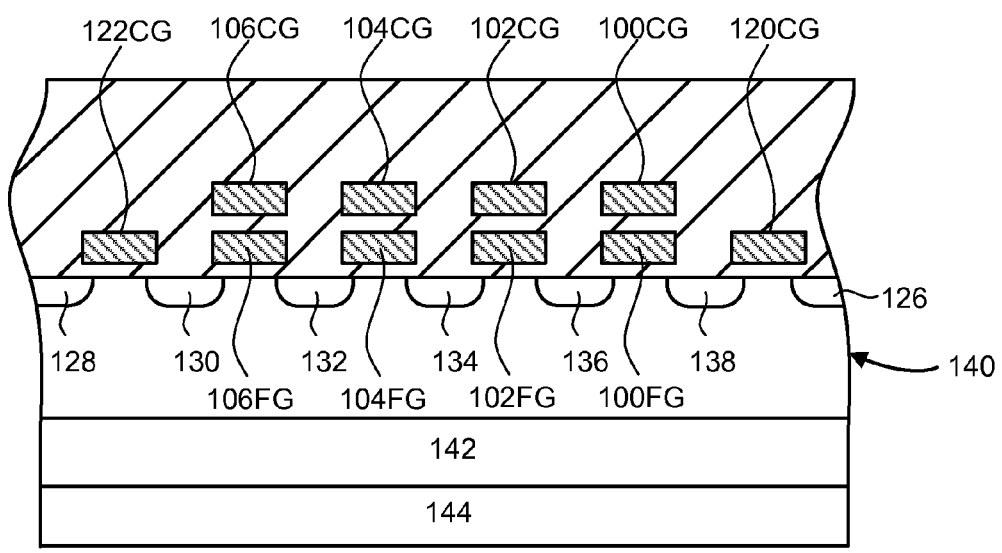
FIG. 2 is a cross-sectional view of the NAND string.

FIG. 2 provides a cross-sectional view of the NAND string described above. The transistors of the NAND string are formed in p-well region 140. The p-well region in turn may be within an n-well region 142 of a p-type substrate 144. Each transistor includes a stacked gate structure that consists of a control gate (100CG, 102CG, 104CG and 106CG) and a floating gate (100FG, 102FG, 104FG and 106FG). The floating gates are formed on the surface of the p-well on top of an oxide or other dielectric film. The control gate is above the floating gate, with an inter-polysilicon dielectric layer separating the control gate and floating gate. The control gates of the memory cells (100, 102, 104 and 106) form the word lines. N+ doped layers 130, 132, 134, 136 and 138 are shared between neighboring cells, whereby the cells are connected to one another in series to form a NAND string. These N+ doped layers form the source and drain of each of the cells. For example, N+ doped layer 130 serves as the drain of transistor 122 and the source for transistor 106, N+ doped layer 132 serves as the drain for transistor 106 and the source for transistor 104, N+ doped layer 134 serves as the drain for transistor 104 and the source for transistor 102, N+ doped layer 136 serves as the drain for transistor 102 and the source for transistor 100, and N+ doped layer 138 serves as the drain for transistor 100 and the source for transistor 120. N+ doped layer 126 connects to the bit line for the NAND string, while N+ doped layer 128 connects to a common source line for multiple NAND strings.

Note that although FIGS. 1a, 1b and 2 show four memory cells in the NAND string, a NAND string used with the technology described herein can have fewer than four memory cells or more than four memory cells. For example, some NAND strings will include 8, 16, 32 or more memory cells.

Each memory cell can store data represented in analog or digital form. When storing one bit of digital data, the range of possible threshold voltages of the memory cell is divided into two ranges, which are assigned logical data "1" and "0." In one example of a NAND-type flash memory, the voltage threshold is negative after the memory cell is erased, and defined as logic "1." The threshold voltage is positive after a program operation, and defined as logic "0." When the threshold voltage is negative and a read is attempted by applying 0 volts to the control gate, the memory cell will turn on to indicate logic one is being stored. When the threshold voltage is positive and a read operation is attempted by applying 0 volts to the control gate, the memory cell will not turn on, which indicates that logic zero is stored.

A memory cell can also store multiple states, thereby storing multiple bits of digital data. In the case of storing multiple states of data, the threshold voltage window is divided into the number of states. For example, if four states are used, there will be four threshold voltage ranges assigned to the data values "11," "10," "01," and "00." In one example of a NAND-type memory, the threshold voltage after an erase operation is negative and defined as "11." Positive threshold voltages are used for the states of "10," "01," and "00." In some implementations, the data values (e.g., logical states) are assigned to the threshold ranges using a Gray code assignment so that if the threshold voltage of a floating gate erroneously shifts to its neighboring physical state, only one bit will be affected. The specific relationship between the data programmed into the memory cell and the threshold voltage ranges of the cell depends upon the data encoding scheme adopted for the memory cells.

Other types of non-volatile memory in addition to NAND flash memory can also be used.

Another type of memory cell useful in flash EEPROM systems utilizes a non-conductive dielectric material in place of a conductive floating gate to store charge in a non-volatile manner. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor.

In another approach, two bits are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric.

Figure 3:
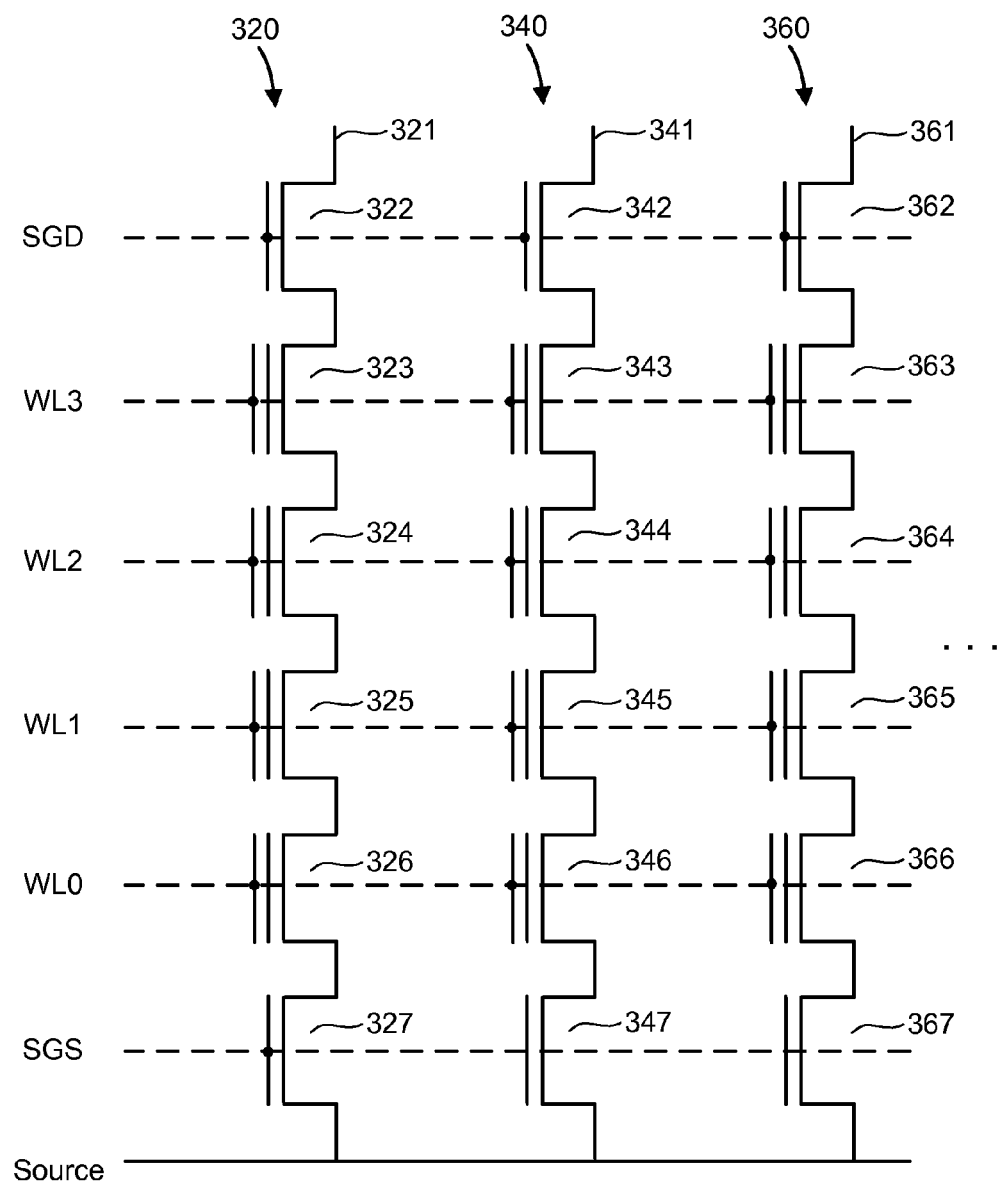
FIG. 3 is a circuit diagram depicting three NAND strings.

FIG. 3 is a circuit diagram depicting three NAND strings. A typical architecture for a flash memory system using a NAND structure will include several NAND strings. For example, three NAND strings 320, 340 and 360 are shown in a memory array having many more NAND strings. Each of the NAND strings includes two select gates and four storage elements. While four storage elements are illustrated for simplicity, modern NAND strings can have up to thirty-two or sixty-four storage elements, for instance.

For example, NAND string 320 includes select gates 322 and 327, and storage elements 323-326, NAND string 340 includes select gates 342 and 347, and storage elements 343-346, NAND string 360 includes select gates 362 and 367, and storage elements 363-366. Each NAND string is connected to the source line by its select gates (e.g., select gates 327, 347 or 367). A selection line SGS is used to control the source side select gates. The various NAND strings 320, 340 and 360 are connected to respective bit lines 321, 341 and 361, by select transistors in the select gates 322, 342, 362, respectively. These select transistors are controlled by a drain select line SGD. In other embodiments, the select lines do not necessarily need to be in common among the NAND strings; that is, different select lines can be provided for different NAND strings. Word line WL3 is connected to the control gates for storage elements 323, 343 and 363. Word line WL2 is connected to the control gates for storage elements 324, 344 and 364. Word line WL1 is connected to the control gates for storage elements 325, 345 and 365. Word line WL0 is connected to the control gates for storage elements 326, 346 and 366. As can be seen, each bit line and the respective NAND string comprise the columns of the array or set of storage elements. The word lines (WL3, WL2, WL1 and WL0) comprise the rows of the array or set. Each word line connects the control gates of each storage element in the row. Or, the control gates may be provided by the word lines themselves. For example, word line WL2 provides the control gates for storage elements 324, 344 and 364. In practice, there can be thousands of storage elements on a word line.

Each storage element can store data. For example, when storing one bit of digital data, the range of possible threshold voltages (Vth) of the storage element is divided into two ranges which are assigned logical data "1" and "0." In one example of a NAND type flash memory, the Vth is negative after the storage element is erased, and defined as logic "1." The Vth after a program operation is positive and defined as logic "0." When the Vth is negative and a read is attempted, the storage element will turn on to indicate logic "1" is being stored. When the Vth is positive and a read operation is attempted, the storage element will not turn on, which indicates that logic "0" is stored. A storage element can also store multiple levels of information, for example, multiple bits of digital data. In this case, the range of Vth value is divided into the number of levels of data. For example, if four levels of information are stored, there will be four Vth ranges assigned to the data values "11", "10", "01", and "00." In one example of a NAND type memory, the Vth after an erase operation is negative and defined as "11". Positive Vth values are used for the states of "10", "01", and "00." The specific relationship between the data programmed into the storage element and the threshold voltage ranges of the element depends upon the data encoding scheme adopted for the storage elements.

When programming a flash storage element, a program voltage is applied to the control gate of the storage element, and the bit line associated with the storage element is grounded. Electrons from the channel are injected into the floating gate. When electrons accumulate in the floating gate, the floating gate becomes negatively charged and the Vth of the storage element is raised. To apply the program voltage to the control gate of the storage element being programmed, that program voltage is applied on the appropriate word line. As discussed above, one storage element in each of the NAND strings share the same word line. For example, when programming storage element 324 of FIG. 3, the program voltage will also be applied to the control gates of storage elements 344 and 364.

However, program disturb can occur at inhibited NAND strings during programming of other NAND strings, and sometimes at the programmed NAND string itself. Program disturb occurs when the threshold voltage of an unselected non-volatile storage element is shifted due to programming of other non-volatile storage elements. Program disturb can occur on previously programmed storage elements as well as erased storage elements that have not yet been programmed. Various program disturb mechanisms can limit the available operating window for non-volatile storage devices such as NAND flash memory.

For example, if NAND string 320 is inhibited (e.g., it is an unselected NAND string which does not contain a storage element which is currently being programmed) and NAND string 340 is being programmed (e.g., it is a selected NAND string which contains a storage element which is currently being programmed), program disturb can occur at NAND string 320. For example, if a pass voltage, Vpass, is low, the channel of the inhibited NAND string is not well boosted, and a selected word line of the unselected NAND string can be unintentionally programmed. In another possible scenario, the boosted voltage can be lowered by Gate Induced Drain Leakage (GIDL) or other leakage mechanisms, resulting in the same problem. Other effects, such as shifts in the Vth of a charge storage element due to capacitive coupling with other neighboring storage elements that are programmed later, can also contribute to program disturb.

Figure 4:
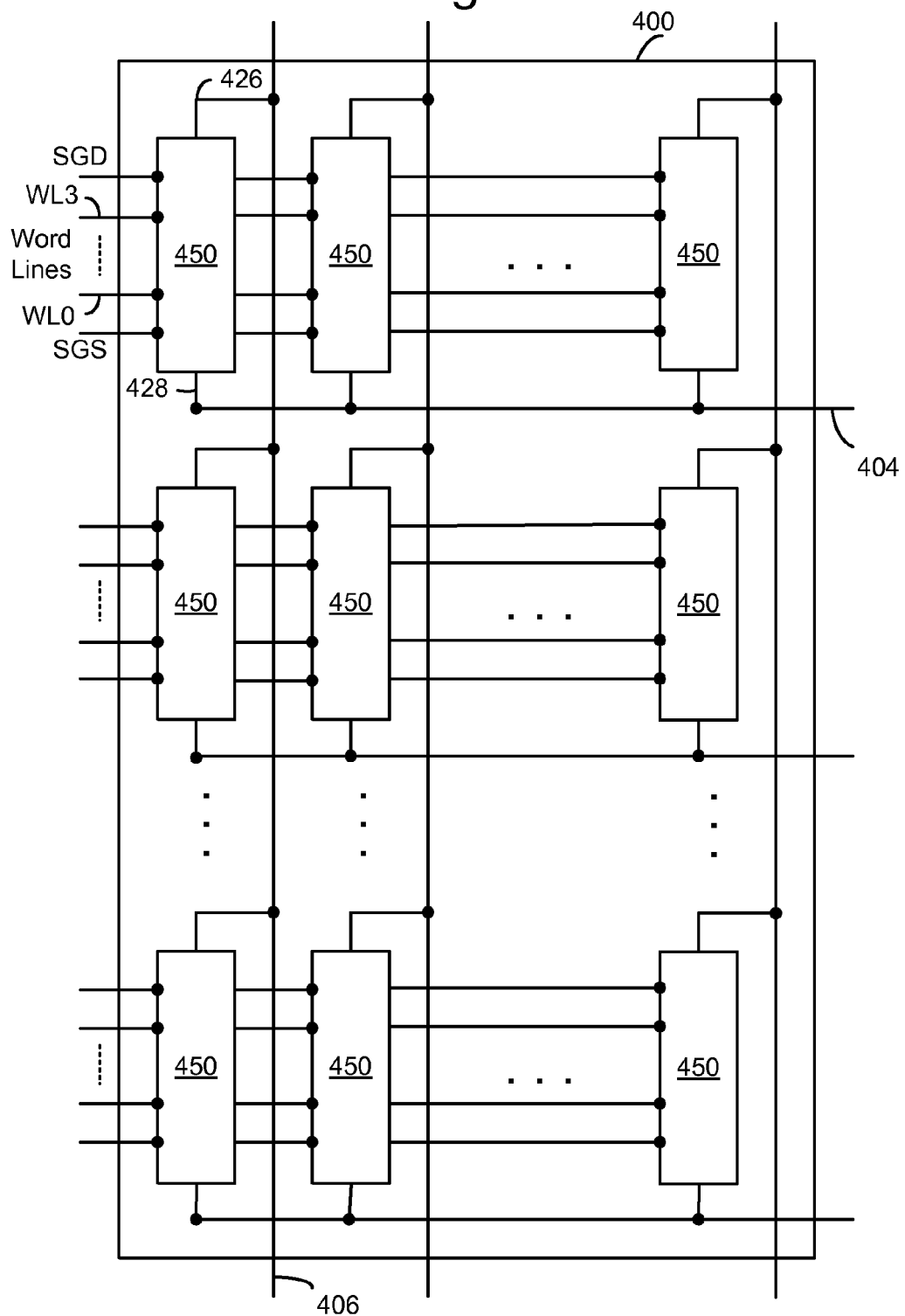
FIG. 4 is a block diagram of an array of NAND flash storage elements.

FIG. 4 illustrates an example of an array 400 of NAND storage elements, such as those shown in FIGS. 1a and 1b. Along each column, a bit line 406 is coupled to the drain terminal 426 of the drain select gate for the NAND string 450. Along each row of NAND strings, a source line 404 may connect all the source terminals 428 of the source select gates of the NAND strings.

The array of storage elements is divided into a large number of blocks of storage elements. As is common for flash EEPROM systems, the block is the unit of erase. That is, each block contains the minimum number of storage elements that are erased together. Each block is typically divided into a number of pages. A page is the smallest unit of programming. One or more pages of data are typically stored in one row of storage elements. For example, a row typically contains several interleaved pages or it may constitute one page. All storage elements of a page will be read or programmed together. Moreover, a page can store user data from one or more sectors. A sector is a logical concept used by the host as a convenient unit of user data; it typically does not contain overhead data, which is confined to the controller. Overhead data may include an Error Correction Code (ECC) that has been calculated from the user data of the sector. A portion of the controller (described below) calculates the ECC when data is being programmed into the array, and also checks it when data is being read from the array. Alternatively, the ECCs and/or other overhead data are stored in different pages, or even different blocks, than the user data to which they pertain.

A sector of user data is typically 512 bytes, corresponding to the size of a sector in magnetic disk drives. Overhead data is typically an additional 16-20 bytes. A large number of pages form a block, anywhere from 8 pages, for example, up to 32, 64, 128 or more pages. In some embodiments, a row of NAND strings comprises a block.

Memory storage elements are erased in one embodiment by raising the p-well to an erase voltage (e.g., 14-22 V) for a sufficient period of time and grounding the word lines of a selected block while the source and bit lines are floating. Due to capacitive coupling, the unselected word lines, bit lines, select lines, and c-source are also raised to a significant fraction of the erase voltage. A strong electric field is thus applied to the tunnel oxide layers of selected storage elements and the data of the selected storage elements are erased as electrons of the floating gates are emitted to the substrate side, typically by Fowler-Nordheim tunneling mechanism. As electrons are transferred from the floating gate to the p-well region, the threshold voltage of a selected storage element is lowered. Erasing can be performed on the entire memory array, separate blocks, or another unit of storage elements.

Figure 5:
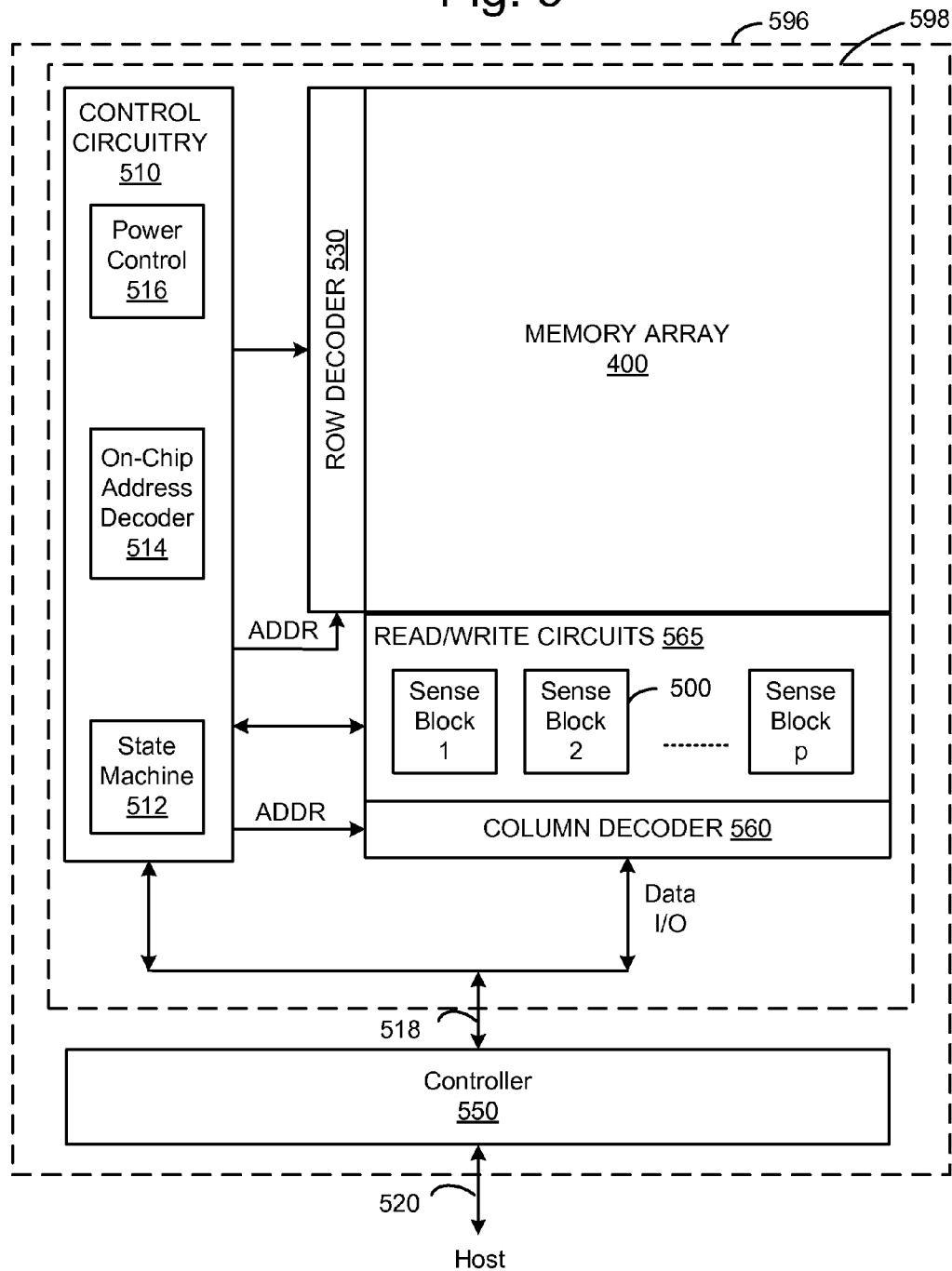
FIG. 5 is a block diagram of a non-volatile memory system using single row/column decoders and read/write circuits.

FIG. 5 is a block diagram of a non-volatile memory system using single row/column decoders and read/write circuits. The diagram illustrates a memory device 596 having read/write circuits for reading and programming a page of storage elements in parallel, according to one embodiment. Memory device 596 may include one or more memory die 598. Memory die 598 includes a two-dimensional array of storage elements 400, control circuitry 510, and read/write circuits 565. In some embodiments, the array of storage elements can be three dimensional. The memory array 400 is addressable by word lines via a row decoder 530 and by bit lines via a column decoder 560. The read/write circuits 565 include multiple sense blocks 500 and allow a page of storage elements to be read or programmed in parallel. Typically a controller 550 is included in the same memory device 596 (e.g., a removable storage card) as the one or more memory die 598. Commands and Data are transferred between the host and controller 550 via lines 520 and between the controller and the one or more memory die 598 via lines 518.

The control circuitry 510 cooperates with the read/write circuits 565 to perform memory operations on the memory array 400. The control circuitry 510 includes a state machine 512, an on-chip address decoder 514, and a power control module 516. The state machine 512 provides chip-level control of memory operations. The on-chip address decoder 514 provides an address interface between that used by the host or a memory controller to the hardware address used by the decoders 530 and 560. The power control module 516 controls the power and voltages supplied to the word lines and bit lines during memory operations.

In some implementations, some of the components of FIG. 5 can be combined. In various designs, one or more of the components (alone or in combination), other than storage element array 400, can be thought of as a managing or control circuit. For example, one or more managing or control circuits may include any one of or a combination of control circuitry 510, state machine 512, decoders 514/560, power control 516, sense blocks 500, read/write circuits 565, controller 550, etc.

In another embodiment, a non-volatile memory system uses dual row/column decoders and read/write circuits. Access to the memory array 400 by the various peripheral circuits is implemented in a symmetric fashion, on opposite sides of the array, so that the densities of access lines and circuitry on each side are reduced by half. Thus, the row decoder is split into two row decoders and the column decoder into two column decoders. Similarly, the read/write circuits are split into read/write circuits connecting to bit lines from the bottom and read/write circuits connecting to bit lines from the top of the array 400. In this way, the density of the read/write modules is essentially reduced by one half.

Figure 6:
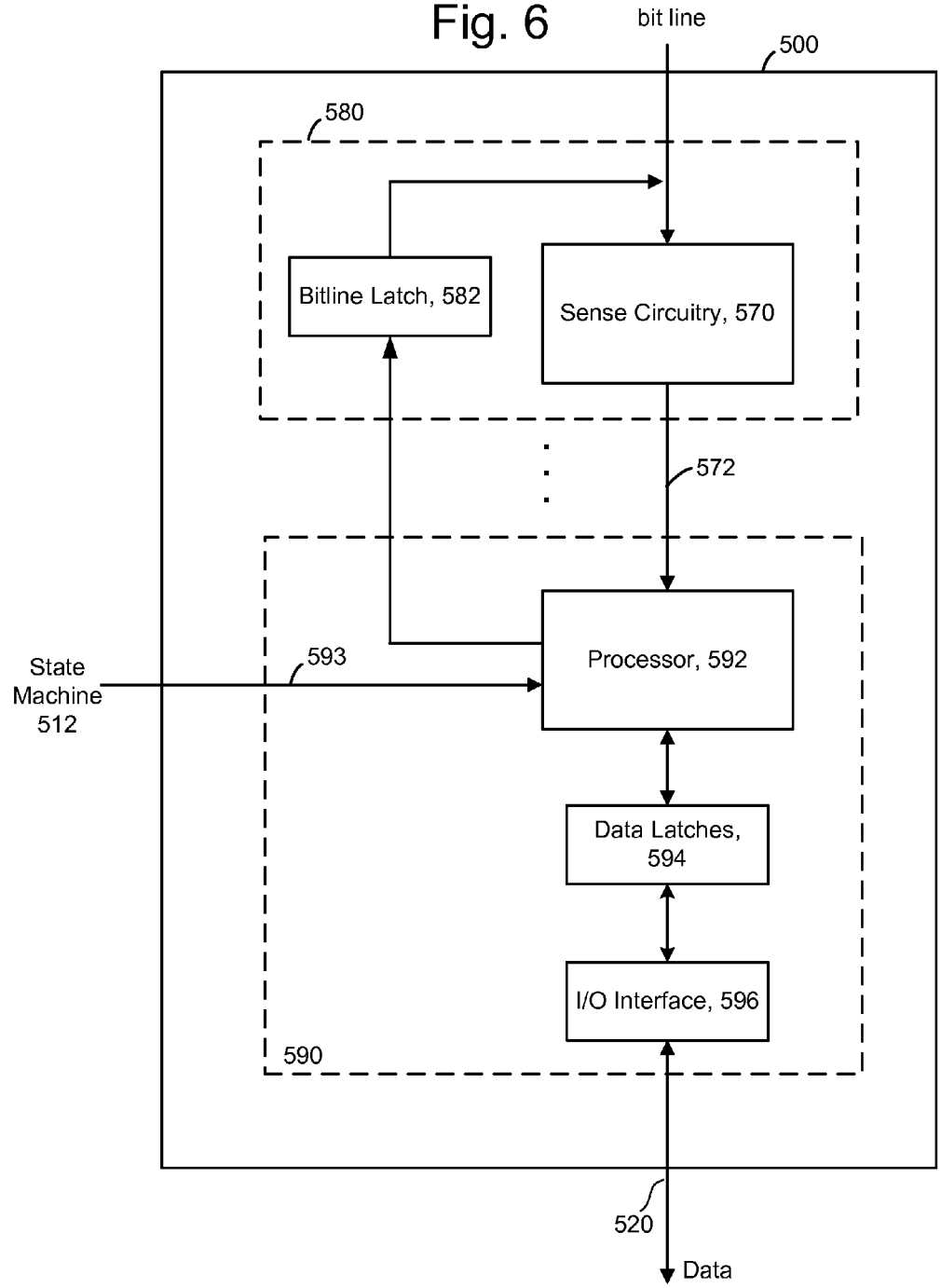
FIG. 6 is a block diagram depicting one embodiment of a sense block.

FIG. 6 is a block diagram depicting one embodiment of a sense block. An individual sense block 500 is partitioned into a core portion, referred to as a sense module 580, and a common portion 590. In one embodiment, there will be a separate sense module 580 for each bit line and one common portion 590 for a set of multiple sense modules 580. In one example, a sense block will include one common portion 590 and eight sense modules 580. Each of the sense modules in a group will communicate with the associated common portion via a data bus 572.

Sense module 580 comprises sense circuitry 570 that determines whether a conduction current in a connected bit line is above or below a predetermined threshold level. Sense module 580 also includes a bit line latch 582 that is used to set a voltage condition on the connected bit line. For example, a predetermined state latched in bit line latch 582 will result in the connected bit line being pulled to a state designating program inhibit (e.g., 1.5-3 V).

Common portion 590 comprises a processor 592, a set of data latches 594 and an I/O Interface 596 coupled between the set of data latches 594 and data bus 520. Processor 592 performs computations. For example, one of its functions is to determine the data stored in the sensed storage element and store the determined data in the set of data latches. The set of data latches 594 is used to store data bits determined by processor 592 during a read operation. It is also used to store data bits imported from the data bus 520 during a program operation. The imported data bits represent write data meant to be programmed into the memory. I/O interface 596 provides an interface between data latches 594 and the data bus 520.

During read or sensing, the operation of the system is under the control of state machine 512 that controls the supply of different control gate voltages to the addressed storage element. As it steps through the various predefined control gate voltages corresponding to the various memory states supported by the memory, the sense module 580 may trip at one of these voltages and an output will be provided from sense module 580 to processor 592 via bus 572. At that point, processor 592 determines the resultant memory state by consideration of the tripping event(s) of the sense module and the information about the applied control gate voltage from the state machine via input lines 593. It then computes a binary encoding for the memory state and stores the resultant data bits into data latches 594. In another embodiment of the core portion, bit line latch 582 serves double duty, both as a latch for latching the output of the sense module 580 and also as a bit line latch as described above.

Some implementations can include multiple processors 592. In one embodiment, each processor 592 will include an output line (not depicted) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense modules, the state machine needs to read the wired-OR line eight times, or logic is added to processor 592 to accumulate the results of the associated bit lines such that the state machine need only read the wired-OR line one time. Similarly, by choosing the logic levels correctly, the global state machine can detect when the first bit changes its state and change the algorithms accordingly.

During program or verify, the data to be programmed is stored in the set of data latches 594 from the data bus 520. The program operation, under the control of the state machine, comprises a series of programming voltage pulses applied to the control gates of the addressed storage elements. Each program pulse is followed by a read back (verify) to determine if the storage element has been programmed to the desired memory state. Processor 592 monitors the read back memory state relative to the desired memory state. When the two are in agreement, the processor 592 sets the bit line latch 582 so as to cause the bit line to be pulled to a state designating program inhibit. This inhibits the storage element coupled to the bit line from further programming even if program pulses appear on its control gate. In other embodiments the processor initially loads the bit line latch 582 and the sense circuitry sets it to an inhibit value during the verify process.

Data latch stack 594 contains a stack of data latches corresponding to the sense module. In one embodiment, there are three data latches per sense module 580. In some implementations (but not required), the data latches are implemented as a shift register so that the parallel data stored therein is converted to serial data for data bus 520, and vice versa. In the preferred embodiment, all the data latches corresponding to the read/write block of m storage elements can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Figure 7:
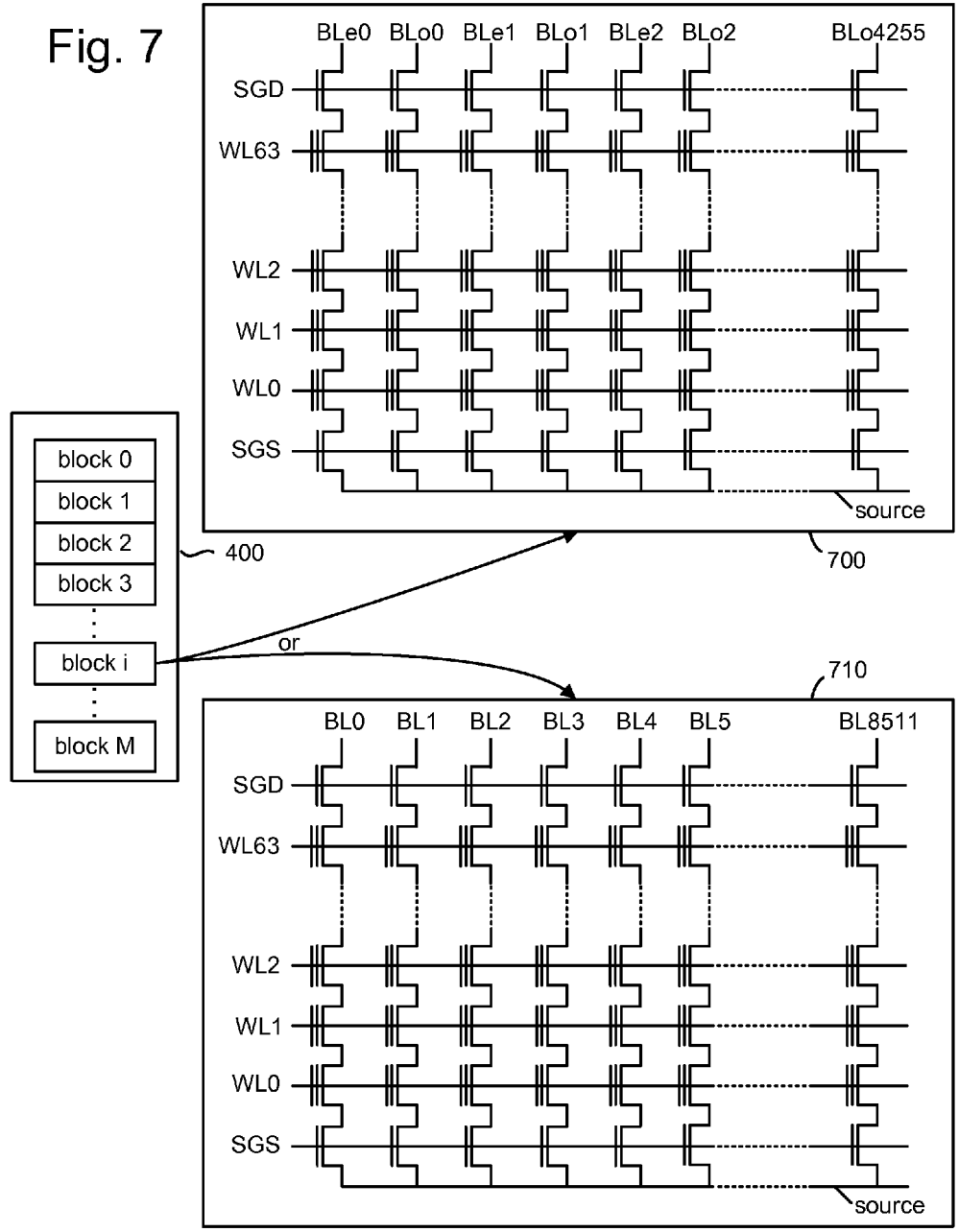
FIG. 7 illustrates an example of an organization of a memory array into blocks for an all bit line memory architecture or for an odd-even memory architecture.

FIG. 7 illustrates an example of an organization of a memory array into blocks for an all bit line memory architecture or for an odd-even memory architecture. Exemplary structures of memory array 400 are described. As one example, a NAND flash EEPROM is described that is partitioned into 1,024 blocks. The data stored in each block can be simultaneously erased. In one embodiment, the block is the minimum unit of storage elements that are simultaneously erased. In each block, in this example, there are 8,512 columns corresponding to bit lines BL0, BL1, . . . BL8511. In one embodiment referred to as an all bit line (ABL) architecture (architecture 710), all the bit lines of a block can be simultaneously selected during read and program operations. Storage elements along a common word line and connected to any bit line can be programmed at the same time.

In the example provided, four storage elements are connected in series to form a NAND string. Although four storage elements are shown to be included in each NAND string, more or less than four can be used (e.g., 16, 32, 64 or another number). One terminal of the NAND string is connected to a corresponding bit line via a drain select gate (connected to select gate drain lines SGD), and another terminal is connected to c-source via a source select gate (connected to select gate source line SGS).

In another embodiment, referred to as an odd-even architecture (architecture 700), the bit lines are divided into even bit lines (BLe) and odd bit lines (BLo). In the odd/even bit line architecture, storage elements along a common word line and connected to the odd bit lines are programmed at one time, while storage elements along a common word line and connected to even bit lines are programmed at another time. In each block, in this example, there are 8,512 columns that are divided into even columns and odd columns, and sixty-four storage elements are shown connected in series in a column to form a NAND string.

During one configuration of read and program operations, 4,256 storage elements are simultaneously selected. The storage elements selected have the same word line and the same kind of bit line (e.g., even or odd). Therefore, 532 bytes of data, which form a logical page, can be read or programmed simultaneously, and one block of the memory can store at least eight logical pages (four word lines, each with odd and even pages). For multi-state storage elements, when each storage element stores two bits of data, where each of these two bits are stored in a different page, one block stores sixteen logical pages. Other sized blocks and pages can also be used.

For either the ABL or the odd-even architecture, storage elements can be erased by raising the p-well to an erase voltage (e.g., 20 V) and grounding the word lines of a selected block. The source and bit lines are floating. Erasing can be performed on the entire memory array, separate blocks, or another unit of the storage elements which is a portion of the memory device. Electrons are transferred from the floating gates of the storage elements to the p-well region so that the Vth of the storage elements becomes negative.

In the read and verify operations, the select gates (SGD and SGS) are connected to a voltage in a range of 2.5-4.5 V and the unselected word lines (e.g., WL0, WL1 and WL3, when WL2 is the selected word line) are raised to a read pass voltage, $V_{READ}$, (typically a voltage in the range of 4.5 to 6 V) to make the transistors operate as pass gates. The selected word line WL2 is connected to a voltage, a level of which is specified for each read and verify operation in order to determine whether a Vth of the concerned storage element is above or below such level. For example, in a read operation for a two-level storage element, the selected word line WL2 may be grounded, so that it is detected whether the Vth is higher than 0 V. In a verify operation for a two level storage element, the selected word line WL2 is connected to 0.8 V, for example, so that it is verified whether or not the Vth has reached at least 0.8 V. The source and p-well are at 0 V. The selected bit lines, assumed to be the even bit lines (BLe), are pre-charged to a level of, for example, 0.7 V. If the Vth is higher than the read or verify level on the word line, the potential level of the bit line (BLe) associated with the storage element of interest maintains the high level because of the non-conductive storage element. On the other hand, if the Vth is lower than the read or verify level, the potential level of the concerned bit line (BLe) decreases to a low level, for example, less than 0.5 V, because the conductive storage element discharges the bit line. The state of the storage element can thereby be detected by a voltage comparator sense amplifier that is connected to the bit line.

Figure 8:
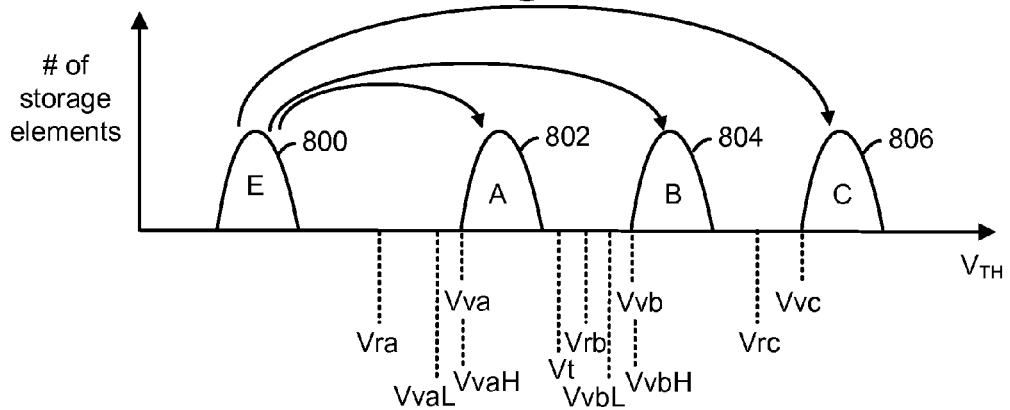
FIG. 8 depicts an example set of threshold voltage distributions and one-pass programming.

FIG. 8 depicts an example set of threshold voltage distributions and one-pass programming. Example threshold voltage distributions for the storage element array are provided for a case where each storage element stores two bits of data. A first threshold voltage distribution 800 is provided for erased (E state) storage elements. Three threshold voltage distributions 802, 804 and 806 represent programmed states A, B and C, respectively. In one embodiment, the threshold voltages in the E distribution are negative and the threshold voltages in the A, B and C distributions are positive.

The number of storage elements which are in a particular state can be determined by maintaining a count of storage elements whose threshold voltage is determined to exceed the corresponding verify level.

Each distinct threshold voltage range corresponds to predetermined values for the set of data bits. The specific relationship between the data programmed into the storage element and the threshold voltage levels of the storage element depends upon the data encoding scheme adopted for the storage elements. In one embodiment, data values are assigned to the threshold voltage ranges using a Gray code assignment so that if the threshold voltage of a floating gate erroneously shifts to its neighboring physical state, only one bit will be affected. One example assigns "11" to threshold voltage range E (state E), "10" to threshold voltage range A (state A), "00" to threshold voltage range B (state B) and "01" to threshold voltage range C (state C). However, in other embodiments, Gray code is not used. Although four states are shown, the other multi-state structures including those that include more or less than four states can also be used.

Three read reference voltages, Vra, Vrb and Vrc, are also provided for reading data from storage elements. By testing whether the threshold voltage of a given storage element is above or below Vra, Vrb and Vrc, the system can determine the state, e.g., programming condition, the storage element is in.

Further, three verify reference voltages, Vva, Vvb and Vvc, are provided. When programming storage elements to state A, the system will test whether those storage elements have a threshold voltage greater than or equal to Vva. When programming storage elements to state B, the system will test whether the storage elements have threshold voltages greater than or equal to Vvb. When programming storage elements to state C, the system will determine whether storage elements have their threshold voltage greater than or equal to Vvc.

Figure 16A:
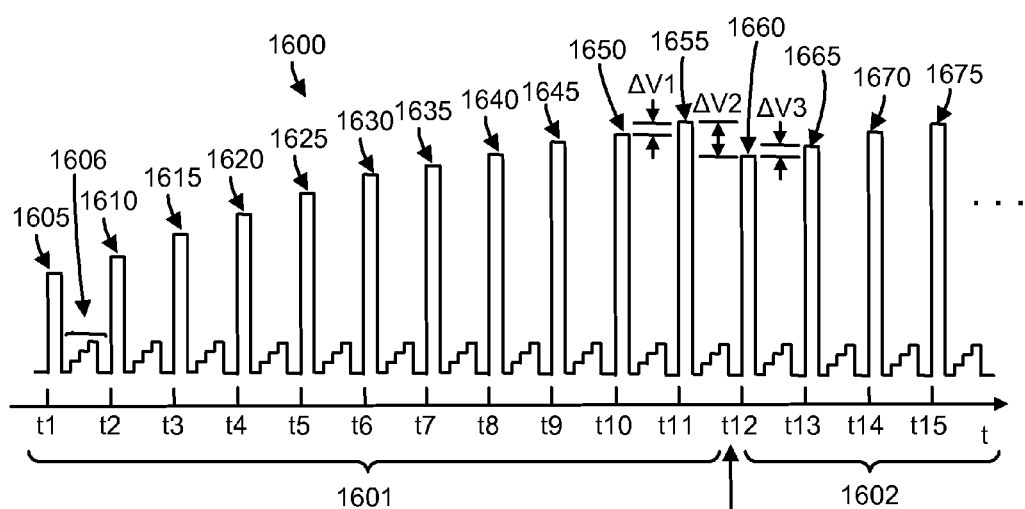
FIG. 16a depicts program pulses applied to a selected word line in a program operation, where there is a step-down in programming voltage applied to WLn, corresponding to a step-up in pass voltage applied to WLn−1 and WLn+1 in FIG. 16b.

In one embodiment, known as full sequence programming, storage elements can be programmed from the erase state E directly to any of the programmed states A, B or C. For example, a population of storage elements to be programmed may first be erased so that all storage elements in the population are in erased state E. A series of program pulses such as depicted in FIG. 16a will then be used to program storage elements directly into states A, B or C. While some storage elements are being programmed from state E to state A, other storage elements are being programmed from state E to state B and/or from state E to state C. When programming from state E to state C on WLn, the amount of parasitic coupling to the adjacent floating gate under WLn−1 reaches a maximum since the change in amount of charge on the floating gate under WLn is the largest as compared to the change in charge when programming from state E to state A or state E to state B. When programming from state E to state B the amount of coupling to the adjacent floating gate is less. When programming from state E to state A the amount of coupling is reduced even further.

Vt represents a verify level which is not a verify level for a data state. It can be used as a trigger to start a second program phase, as discussed further below, e.g., in connection with FIGS. 16a and 16b. In this case, Vt is between Vva and Vvb, the verify levels for data states A and B, respectively.

Another option is to use low and high verify levels for one or more data states. For example, VvaL and VvaH are lower and higher verify levels for the A state, and VvbL and VvbH are lower and higher verify levels for the B state. During programming, when the threshold voltage of a storage element which is being programmed to the A state as a target state exceeds VvaL, the programming speed of the storage element is slowed down, such as by raising the associated bit line voltage to a level which is between a program or non-inhibit level and a full inhibit level. This provides greater accuracy by avoiding large step increases in threshold voltage. When the threshold voltage reaches VvaH, the storage element is locked out from further programming. Similarly, when the threshold voltage of a storage element which is being programmed to the B state as a target state exceeds VvbL, the programming speed of the storage element is slowed down, and when the threshold voltage reaches VvbH, the storage element is locked out from further programming. This programming technique has been referred to as a quick pass write or dual verify technique. Note that, in one approach, dual verify levels are not used for the highest state since some overshoot is typically acceptable. Instead, the dual verify levels can be used for the programmed states, above the erased state, and below the highest state.

Figure 9:
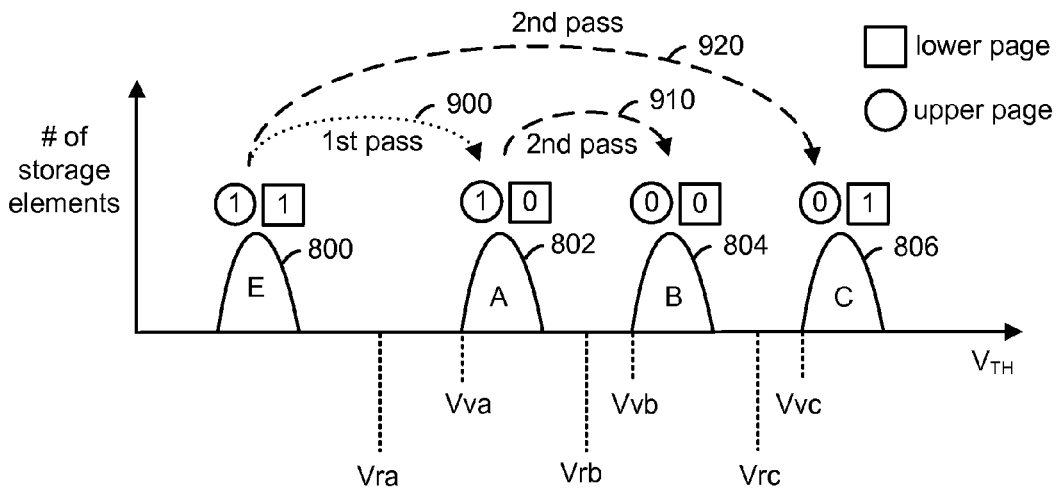
FIG. 9 depicts an example set of threshold voltage distributions and two-pass programming.

FIG. 9 illustrates an example of a two-pass technique of programming a multi-state storage element that stores data for two different pages: a lower page and an upper page. Four states are depicted by repeating the threshold voltage distributions 800, 802, 804 and 806 from FIG. 8. These states, and the bits they represent, are: state E (11), state A (10), state B (00) and state C (01). For state E, both pages store a "1." For state A, the lower page stores a "0" and the upper page stores a "1." For state B, both pages store "0." For state C, the lower page stores "1" and the upper page stores "0." Note that although specific bit patterns have been assigned to each of the states, different bit patterns may also be assigned.

In a first programming pass, the storage element's threshold voltage level is set according to the bit to be programmed into the lower logical page. If that bit is a logic "1," the threshold voltage is not changed since it is in the appropriate state as a result of having been earlier erased. However, if the bit to be programmed is a logic "0," the threshold level of the storage element is increased to be state A, as shown by arrow 900. That concludes the first programming pass.

In a second programming pass, the storage element's threshold voltage level is set according to the bit being programmed into the upper logical page. If the upper logical page bit is to store a logic "1," then no programming occurs since the storage element is in one of the states E or A, depending upon the programming of the lower page bit, both of which carry an upper page bit of "1." If the upper page bit is to be a logic "0," then the threshold voltage is shifted. If the first pass resulted in the storage element remaining in the erased state E, then in the second phase the storage element is programmed so that the threshold voltage is increased to be within state C, as depicted by arrow 920. If the storage element had been programmed into state A as a result of the first programming pass, then the storage element is further programmed in the second pass so that the threshold voltage is increased to be within state B, as depicted by arrow 910. The result of the second pass is to program the storage element into the state designated to store a logic "0" for the upper page without changing the data for the lower page. In both FIG. 8 and FIG. 9, the amount of coupling to the floating gate on the adjacent word line depends on the final state.

In one embodiment, a system can be set up to perform full sequence writing if enough data is written to fill up an entire page. If not enough data is written for a full page, then the programming process can program the lower page programming with the data received. When subsequent data is received, the system will then program the upper page. In yet another embodiment, the system can start writing in the mode that programs the lower page and convert to full sequence programming mode if enough data is subsequently received to fill up an entire (or most of a) word line's storage elements.

Figure 10A:
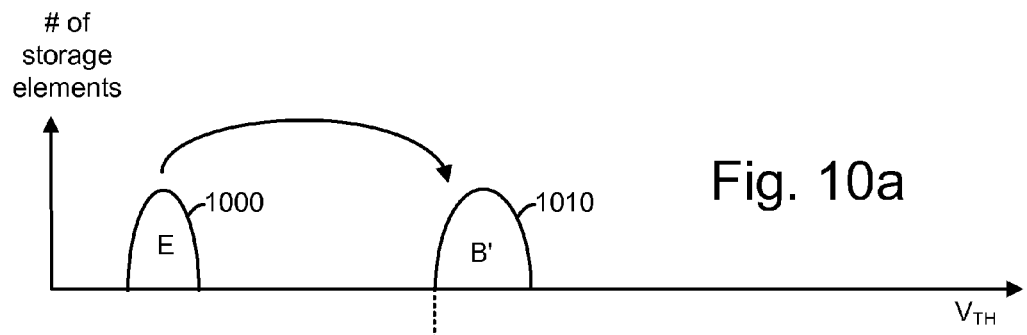
FIGS. 10a-c show various threshold voltage distributions and describe a process for programming non-volatile memory.
Figure 10B:
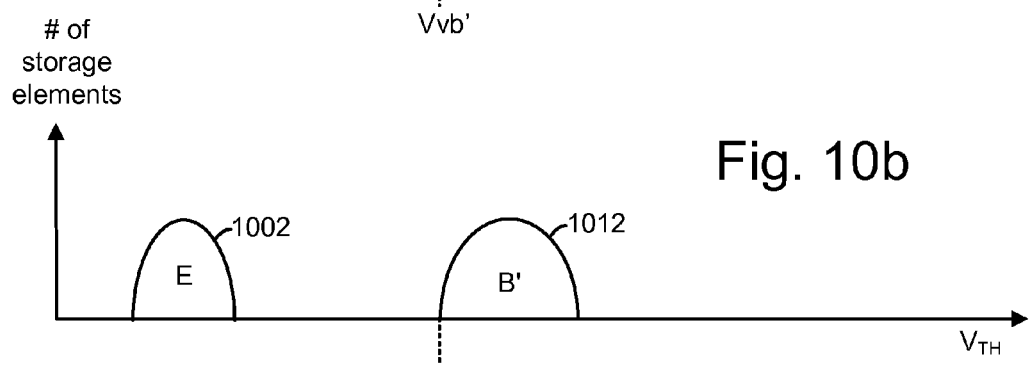
Figure 10C:
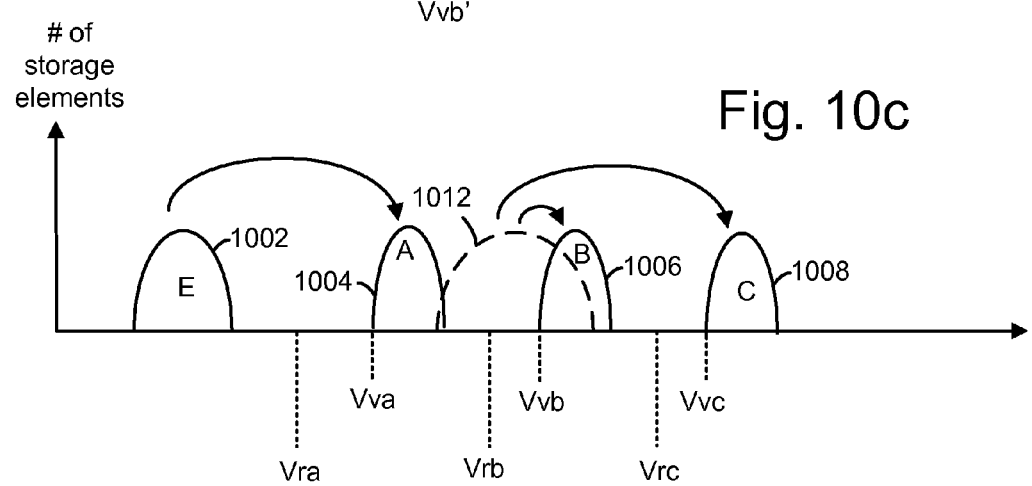

FIGS. 10*a-c* disclose another process for programming non-volatile memory that reduces the effect of floating gate to floating gate coupling by, for any particular storage element, writing to that particular storage element with respect to a particular page subsequent to writing to adjacent storage elements for previous pages. In one example implementation, the non-volatile storage elements store two bits of data per storage element, using four data states. For example, assume that state E is the erased state and states A, B and C are the programmed states. State E stores data 11. State A stores data 01. State B stores data 10. State C stores data 00. This is an example of non-Gray coding because both bits change between adjacent states A and B. Other encodings of data to physical data states can also be used. Each storage element stores two pages of data. For reference purposes, these pages of data will be called upper page and lower page; however, they can be given other labels. With reference to state A, the upper page stores bit 0 and the lower page stores bit 1. With reference to state B, the upper page stores bit 1 and the lower page stores bit 0. With reference to state C, both pages store bit data 0.

The programming process is a two-step process. In the first step, the lower page is programmed. If the lower page is to remain data 1, then the storage element state remains at state E (distribution 1000). If the data is to be programmed to 0, then the threshold of voltage of the storage element is raised such that the storage element is programmed to state B' (distribution 1010). FIG. 10*a* therefore shows the programming of storage elements from state E to state B'. State B' is an interim state B; therefore, the verify point is depicted as Vvb', which is lower than Vvb.

Note that the distribution 1010 can have an associated temporary or interim distribution (not shown) which the B' state storage elements undergo before reaching the distribution 1010.

In one embodiment, after a storage element is programmed from state E to state B', its neighbor storage element (WLn+1) in the NAND string will then be programmed with respect to its lower page. For example, looking back at FIG. 2, after the lower page for storage element 106 is programmed, the lower page for storage element 104 would be programmed. After programming storage element 104, the floating gate to floating gate coupling effect will raise the apparent threshold voltage of storage element 106 if storage element 104 had a threshold voltage raised from state E to state B'. This will have the effect of widening the threshold voltage distribution for state B' to that depicted as threshold voltage distribution 1012 of FIG. 10*b*. This apparent widening of the threshold voltage distribution will be remedied when programming the upper page. The E state may also be widened, to a lesser extent, as depicted by distribution 1002.

FIG. 10*c* depicts the process of programming the upper page. If the storage element is in erased state E and the upper page is to remain at 1, then the storage element will remain in state E (distribution 1002). If the storage element is in state E and its upper page data is to be programmed to 0, then the threshold voltage of the storage element will be raised so that the storage element is in state A (distribution 1004). If the storage element was in intermediate threshold voltage distribution 1012 and the upper page data is to remain at 1, then the storage element will be programmed to final state B (distribution 1006). If the storage element is in intermediate threshold voltage distribution 1012 and the upper page data is to become data 0, then the threshold voltage of the storage element will be raised so that the storage element is in state C (distribution 1008). The process depicted by FIGS. 10*a-c* reduces the effect of floating gate to floating gate coupling because only the upper page programming of neighbor storage elements will have an effect on the apparent threshold voltage of a given storage element. An example of an alternate state coding is to move from distribution 1012 to state C when the upper page data is a 1, and to move to state B when the upper page data is a 0.

Although FIGS. 10*a-c* provide an example with respect to four data states and two pages of data, the concepts taught can be applied to other implementations with more or fewer than four states and more or less than two pages. For example, memory devices with eight or sixteen states per storage element are currently planned or in production.

Figure 11:
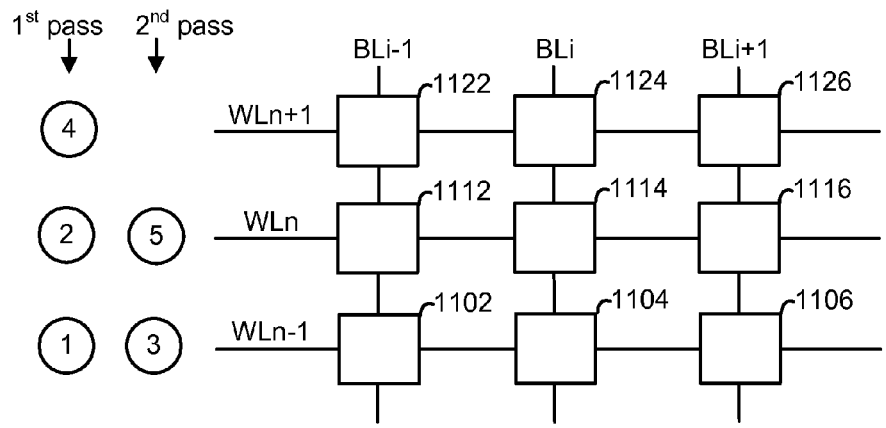
FIG. 11 depicts a multi-pass program operation for a set of storage elements.

FIG. 11 depicts a multi-pass program operation for a set of storage elements. The components depicted may be a subset of a much larger set of storage elements, word lines and bit lines. In one possible program operation, storage elements on WLn−1, e.g., storage elements 1102, 1104 and 1106, are programmed in a first programming pass. This step is represented by the circled "1." Next ("2"), storage elements on WLn, e.g., storage elements 1112, 1114 and 1116, are programmed in a first programming pass. In this example, when a word line is selected for programming, verify operations occur after each program pulse. During the verify operations on WLn, one or more verify voltages are applied to WLn and pass voltages are applied to the remaining word lines including WLn−1 and WLn+1. The pass voltages are used to turn on (make conductive) the unselected storage elements so that a sensing operation can occur for the selected word line. Next ("3"), storage elements on WLn−1 are programmed in a second programming pass. Next ("4"), storage elements on WLn+1 are programmed in a first programming pass. Next ("5"), the storage elements on WLn are programmed in a second programming pass to their final respective states.

Due to the programming on WLn+1, the storage elements on WLn are affected by coupling which tends to raise and widen their threshold voltage distribution for each state. This can occur during both single-pass and multi-pass programming. In single-pass pass programming, each word line is programmed completely before moving to the next word line, e.g., WLn−1, then WLn, then WLn+1.

Figure 12:
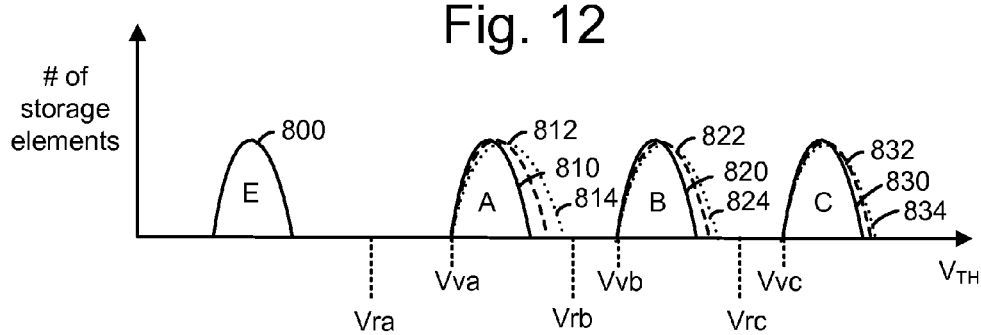
FIG. 12 depicts threshold voltage distributions of a set of storage elements for fresh and cycled memory devices, and for different pass voltages used on WLn−1 and WLn+1.

FIG. 12 depicts threshold voltage distributions of a set of storage elements for fresh and cycled memory devices, and for different pass voltages used on WLn−1 and WLn+1. In this example, there are four states: the erased state (E) and three programmed states A, B and C. For a fresh memory device, which has experienced no, or few, program-erase cycles, the distributions for states E, A, B and C are represented by distributions 800, 810, 820 and 830 respectively. For a cycled device, which has experienced hundred or thousands of program-erase cycles, the distributions tend to be widened for the programmed states A, B and C. The widening is worse for the lower programmed state or states. The widening causes device reliability problems and severely limits device endurance.

Notably, the pass voltage which is applied to the word lines (WLn−1 and WLn+1) which are adjacent to a selected word line (WLn have an affect on the amount of widening. For example, distributions 812, 822 and 832 for states A, B and C, respectively, result when a relatively low pass voltage Vpass-low is used on WLn−1 and WLn+1, and distributions 814, 824 and 834 for states A, B and C, respectively, are seen when a relatively high pass voltage Vpass-high is used on WLn−1 and WLn+1. The widening is reduced when a lower pass voltage is used. This is believed to be due to more confined Fowler-Nordheim tunneling and reduced charge injection and trapping at the areas close to the floating gate edges of a selected storage element. See FIGS. 15a-c. The WLn−1 and WLn+1 biases are important for channel boosting, however. If the bias is too low throughout a program operation, program disturb becomes more severe. The other unselected word lines, which are not adjacent to the selected word line, can receive a nominal pass voltage which is typically slightly less than Vpass-high.

Since insufficient boosting disturb fails happen near the end of the program operation when Vpgm becomes high, low biases can be used on WLn−1 and WLn+1 until a late stage of the program operation. At a certain point, the WLn−1 and WLn+1 bias can suddenly increase to guarantee that inhibit channels will have a strong enough boosting potential when the high Vpgm is applied. During programming, the finish of a certain state can be used to trigger this WLn−1/n+1 bias switch. For example, in a four state (two bits per storage element) memory device, with states E, A, B and C, the WLn−1/n+1 bias can be switched from low to high after the B state storage elements finish programming. As another example, in an eight state (three bits per storage element) memory device, with states E, A, B, C, D, E, F and G, the WLn−1/n+1 bias can be switched from low to high after all the E or F state storage elements finish programming.

In this way, low biases on WLn−1 and WLn+1 can be used during programming for as many pulses as possible to suppress the charge trapping at gate edges. When the program operation is close to the end and Vpgm becomes high, high biases are applied on WLn−1/n+1 in time to prevent program disturb.

One concern still exists if using this technique. When WLn−1/n+1 biases increase suddenly, due to control gate-to-floating gate coupling on WLn, the effective Vpgm will also have a sudden increase. For example, if the WLn−1/n+1 bias has a sudden increase of 4-6 V, the effective Vpgm increase on WLn is about 1.2-1.8 V, using a coupling ratio of 0.30. This significant up shift in Vpgm can cause a large increase in the threshold voltage of a storage element after the initial program pulse which is applied with the stepped up pass voltages. To solve this problem, the WLn Vpgm can have a down-shift (from the normal stepped-up voltage) at the same time as the WLn−1/n+1 bias has a sudden increase. The Vpgm down-shift can be chosen to just cancel out the effective Vpgm up-shift from the WLn−1/n+1 bias increase. In this way, the WLn−1/n+1 bias increase will not negatively impact the threshold voltage distribution or the programming speed of the WLn storage elements.

The Vpgm down-shift and WLn−1/n+1 bias increase can be used with any programming technique, included those described herein.

Figure 13A:
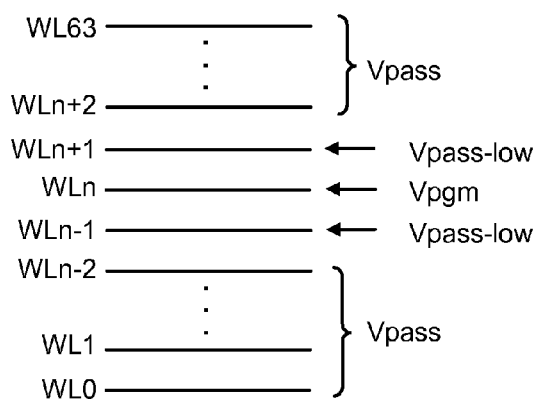
FIG. 13a depicts a first set of pass voltages applied to unselected word lines during programming.

FIG. 13a depicts a first set of pass voltages applied to unselected word lines during programming. A number of word lines in a block, e.g., 64 word lines, extending from WL0 at a source side of the block to WL63 at a drain side of the block, are depicted as an example. WLn represents a selected word line, e.g., a word line which is in communication with storage elements which are to be programmed in a current program operation. WLn−1 represents an adjacent, source-side word line of WLn, and WLn+1 represents an adjacent drain-side word line of WLn. The non-adjacent word lines, which are not adjacent to WLn, are WL0-WLn−2 on the source side of WLn, and WLn+2-WL63 on the drain side of WLn. A program voltage Vpgm is applied to WLn. A set of pass voltages are applied to the unselected word lines, including the nominal value of Vpass, which is applied to WL0-WLn−2 and WLn+2-WL63, and the lower value of Vpass-low, which is applied to WLn−1 and WLn+1.

Figure 13B:
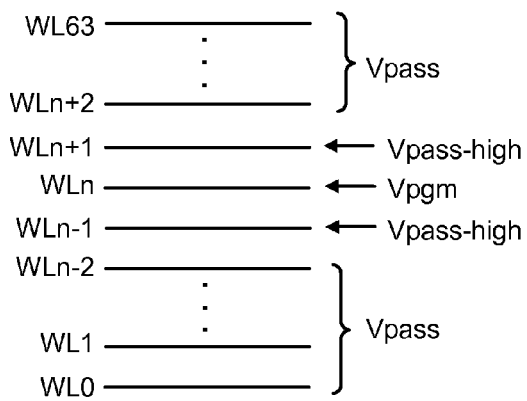
FIG. 13b depicts a second set of pass voltages applied to unselected word lines during programming.

FIG. 13b depicts a second set of pass voltages applied to unselected word lines during programming. Here, Vpgm is applied to WLn, Vpass is applied to WL0-WLn−2 and WLn+2-WL63, and Vpass-high is applied to WLn−1 and WLn+1. For example, Vpass-low may be about 3-4 V, Vpass-high may be about 8-9 V and Vpass may be about 7-8 V. In another possibility, Vpass-high and Vpass are equal.

Figure 14A:
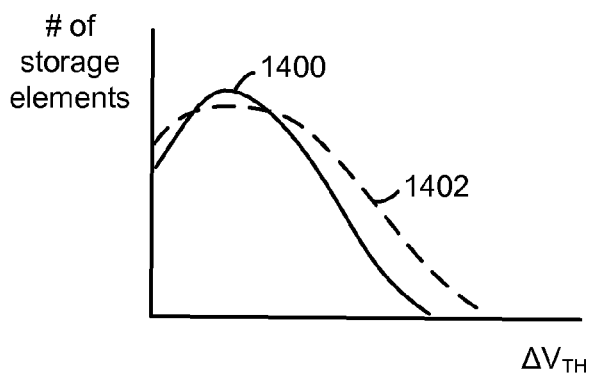
FIG. 14a depicts program noise for fresh and cycled memory devices.

FIG. 14a depicts program noise for fresh and cycled memory devices. The x-axis depicts a change in the threshold voltage ΔVth of a storage element when a particular program pulse is applied. The y-axis depicts a number of storage elements which exhibited a certain ΔVth. Curve 1400 represents a fresh device and cure 1402 represents a cycled device. Here, the increase in ΔVth for the cycled memory device represents an increase in programming noise which makes it more difficult to achieve accurate programming and narrow threshold voltage distributions.

Figure 14B:
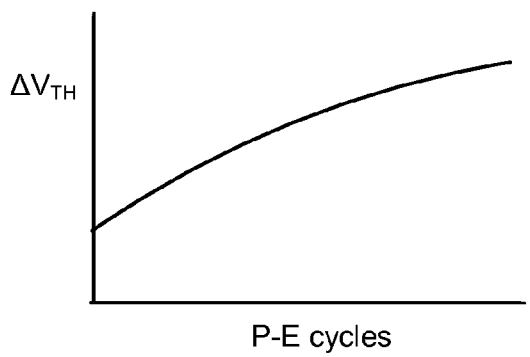
FIG. 14b depicts increased capacitive coupling as a function of a number of program-erase cycles.

FIG. 14b depicts increased capacitive coupling as a function of a number of program-erase cycles. During a program operation, the floating gate of a selected storage element receives capacitive coupling which tends to raise its threshold voltage. Source of capacitive coupling include the floating gate of an adjacent storage element as well as a channel region which is between the selected storage element and the adjacent storage element. Moreover, the threshold voltage shift ΔVth is greater as the number of program-erase (P-E) cycles increases.

Figure 14C:
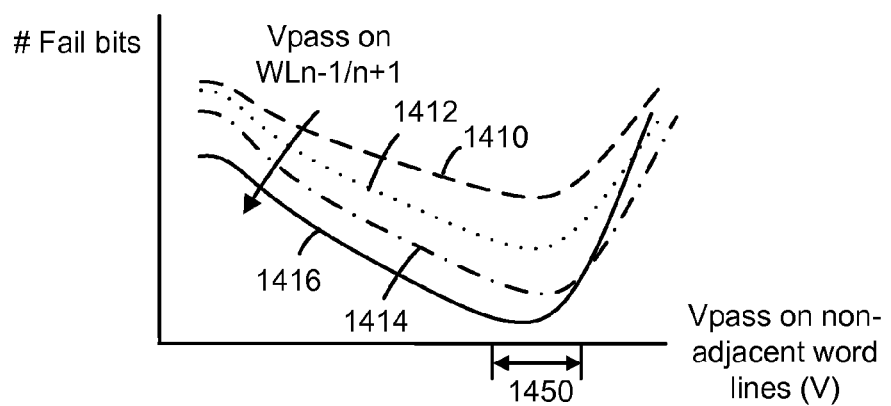
FIG. 14c depicts a number of fail bits for different pass voltages used during programming on WLn−1 and WLn+1, as a function of a nominal pass voltage used during programming on non-adjacent word lines of WLn.

FIG. 14c depicts a number of fail bits for different pass voltages used during programming on WLn−1 and WLn+1, as a function of a nominal pass voltage used during programming on non-adjacent word lines of WLn. Curves 1410, 1412, 1414 and 1416 represent increasing levels of Vpass which are applied to the adjacent word lines WLn−1 and WLn+1 during a program operation. With curves 1410, 1412 and 1414, Vpass is fixed for each program pulse of the program operation. However, with curve 1416, a lower Vpass is used during a first phase of the program operation, and a higher Vpass is used during a second phase of the program operation. The curve 1416 represents the higher Vpass. It can be seen that a Vpass window 1450 exists which defines a range of Vpass values which minimize the number of fail bits. In particular, for a given Vpass in the window 1450 which is applied to the non-adjacent unselected word lines, the number of fail bits is minimized with curve 1416. When lower Vpass levels are applied to the adjacent word lines throughout the program operation (curves 1410, 1412 and 1414), Vpass margin decreases and disturbs caused by insufficient boosting are more likely to occur.

Figure 15A:
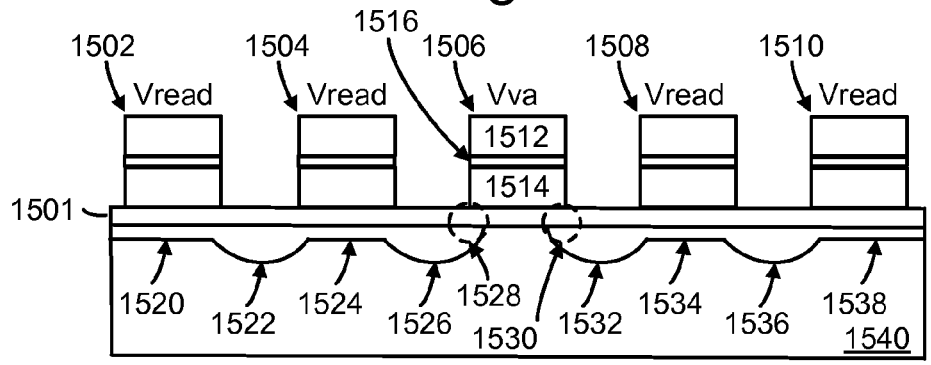
FIG. 15a depicts a cross-sectional view of a NAND string showing charge trapping at edges of a floating gate.

FIG. 15a depicts a cross-sectional view of a NAND string showing charge trapping at edges of a floating gate. The NAND string includes example storage elements 1502, 1504, 1506, 1508 and 1510 formed on a gate oxide 1501 on substrate 1540. The selected storage element 1506 is selected for sensing, such as in a verify operation in which it receives a voltage Vva, for instance, at one point in time. The unselected storage elements 1502, 1504, 1508 and 1510 receive a read pass voltage, Vread, which is sufficiently high to form conductive channels 1520, 1524, 1534 and 1538, respectively. In this example, no channel is formed under the storage element 1506 because Vva does not exceed the threshold voltage of the storage element 1516.

Source/drain regions 1522, 1526, 1532 and 1536 are also depicted. Under the storage element 1506, which includes a control gate 1512, floating gate 1514 and inter-poly dielectric (IPD) 1516, charge trapping can occur in regions 1528 and 1530, near edges of the floating gate 1514. Over multiple program-erase cycles which occur over time, the charge trapping results in electrons accumulating in the regions 1528 and 1530. The charge trapping can form parasitic cells between the floating gates which impact the threshold voltage of the storage element 1506. This impact is seen as an increase in program noise and increased capacitive coupling with write-erase cycles.

Figure 15B:
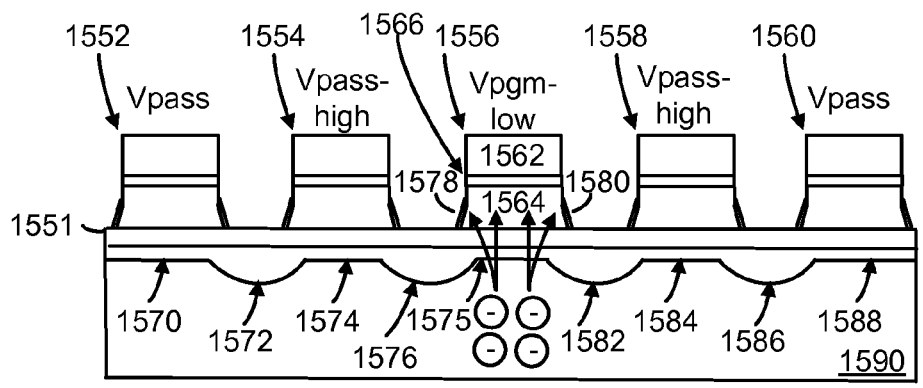
FIG. 15b depicts a cross-sectional view of a NAND string showing injection of electrons outside of a floating gate, as a result of high pass voltages used during programming on WLn−1 and WLn+1.

FIG. 15b depicts a cross-sectional view of a NAND string showing injection of electrons outside of a floating gate, as a result of Vpass-high used during programming on WLn−1 and WLn+1. The NAND string includes example storage elements 1552, 1554, 1556, 1558 and 1560 formed on a gate oxide 1551 on substrate 1590. The selected storage element 1556 is selected for programming and receives a relatively low programming voltage, Vpgm-low, at one point in time. The adjacent unselected storage elements 1554 and 1558 receive Vpass-high, which is sufficiently high to form conductive channels 1574 and 1584, respectively. The non-adjacent storage elements 1552 and 1560 receive Vpass, which is sufficiently high to form conductive channels 1570 and 1588, respectively. A conductive channel 1575 is also formed under the selected storage element 1556. Source/drain regions 1572, 1576, 1582 and 1586 are also depicted. The storage element 1556 includes a control gate 1562, floating gate 1564 and IPD 1566. During the semiconductor fabrication process, polysilicon residues may be formed which cause the floating gates to have slightly sloped wall regions on which IPD is deposited, resulting in IPD fences 1578 and 1580. When a relatively high bias is used on the unselected word lines, electrons (represented by circles with a dash inside) can easily be injected outside of the floating gate, toward the IPD fences. This injection can result in the charge trapping depicted in FIG. 15a.

Figure 15C:
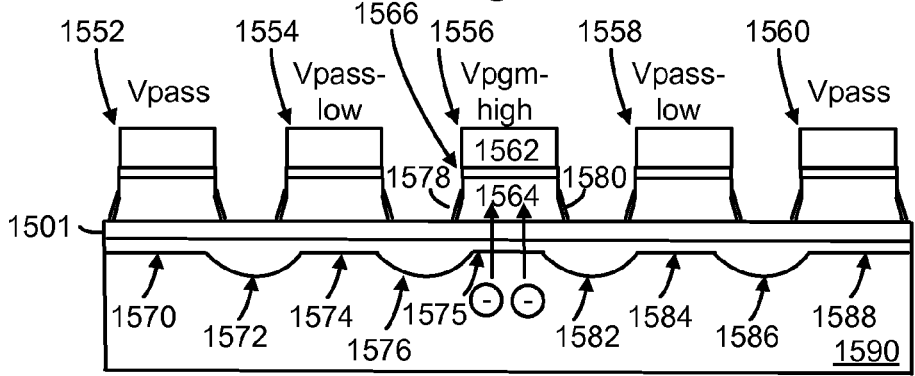
FIG. 15c depicts a cross-sectional view of a NAND string showing confined Fowler-Nordheim tunneling injection to a floating gate, as a result of low pass voltages used during programming on WLn−1 and WLn+1.

FIG. 15c depicts a cross-sectional view of a NAND string showing confined Fowler-Nordheim tunneling injection to a floating gate, as a result of low pass voltages used during programming on WLn−1 and WLn+1. Like-numbered elements correspond to those in FIG. 5b. Here, Vpgm-high is applied to the selected storage element 1556, and a Vpass-low is applied to the adjacent storage elements 1554 and 1558. Vpass is applied to the non-adjacent storage elements 1552 and 1560. By using a low bias on the adjacent word lines during programming, Fowler-Nordheim tunneling injection to the floating gate 1564 is more confined, so that charge injection and trapping at the edges of the floating gate 1564 is reduced. For example, instead of depositing two electrons in a program operation, only one or one-half electron might be deposited, on average. After 1,000 program-erase cycles, instead of having 2,000 electrons trapped, the technique provided herein might result in only 500-1,000 electrons trapped. So, the rate of charge trapping accumulation is slowed.

Figure 16B:
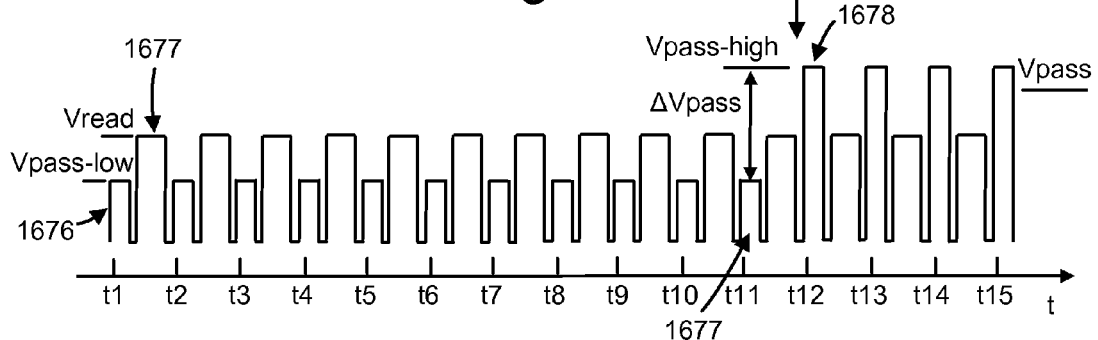
FIG. 16b depicts voltages applied to unselected word lines in a program operation, including a step-up in pass voltage applied to WLn−1 and WLn+1.

FIG. 16a depicts program pulses applied to a selected word line in a program operation, where there is a step-down in programming voltage applied to WLn, corresponding to a step-up in pass voltage applied to WLn−1 and WLn+1 in FIG. 16b. Generally, a program operation can involve applying a pulse train to a selected word line, where the pulse train includes program pulses followed by one or more verify pulses. Note that a program pulse can have any number of different waveform shapes. A square waveform is depicted, although other shapes are possible such as a multilevel shape or a ramped shape. The pulse train 1600 includes a series of program pulses 1605, 1610, 1615, 1620, 1625, 1630, 1635, 1640, 1645, 1650, 1655, 1660, 1665, 1670, 1675 . . . , that are applied to a word line selected for programming, at times t1-t15, respectively. In one embodiment, the program operation includes at least a first phase 1601 and a second phase 1602. In the first phase 1601, the program pulses have a voltage, Vpgm, which starts at an initial level such as 12 V and increases incrementally by an increment $\Delta V1$, e.g., 0.5 V, for each successive program pulse. In the second phase 1602, the initial program pulse is stepped down by $\Delta V2$ from the last program pulse of the first phase. Subsequent program pulses of the second phase increase incrementally by an increment $\Delta V3$ which can be the same as, or greater than, $\Delta V1$ until a maximum of, e.g., 20-25 V is reached.

Thus, in one possible approach, the program pulses increase incrementally by a fixed step size in the different phases. Other variations are possible. For example, the program pulse can increase incrementally by a varying step size in the different phases.

The user of a larger step size in the second phase may be appropriate as lower state storage elements will have completed programming to their target states and will be locked out from further programming, e.g., by raising the voltage on their respective bit lines. The storage elements which are not yet locked out are programmed to higher states. For example, with a four-state memory device having states E, A, B and C, the second phase 1602 may begin when the storage elements which are intended to be programmed to states A and B have completed programming and are locked out. The second phase 1602 may therefore involve programming only C state storage elements. In this case, the verify operations can be limited to determining when the C state storage elements have completed programming. FIG. 16a depicts three verify levels after each program pulse as an example. 0 V may be applied to WLn between the program and verify pulses.

The start of the second program phase 1602 may be triggered in different ways. In one approach, the second program phase is triggered when storage elements complete programming to a particular trigger state. For example, this can be the B state in a four-state memory device, as discussed. Generally, the second or third highest data state can be a trigger state. For example, for an eight-state memory device, with states E, A, B, C, D, E, F and G, the trigger state may be state E or F. This approach is adaptive as the initiation of the second phase can vary based on the performance of different memory devices, or different sets of storage elements (e.g., block or word lines) in a memory device.

It is also possible to use a verify level which is not a verify level for a data state as a trigger to start the second program phase. See Vt in FIG. 8. This provides additional flexibility in determining when the second program phase starts. However, an additional sensing operation may be needed. In another possible approach, the second program phase is initiated when a predetermined number of program pulses have been applied in the program operation.

In a specific example, the first program phase 1601 includes program pulses 1605-1655 and the associated verify operations, and the second program phase 1602 includes program pulses 1660-1675 and the associated verify operations. Program pulse 1655 at t11 is the last pulse in the first phase, and program pulse 1660 at t12 is the first pulse in the second phase. The amplitude of program pulse 1660 is lower than the amplitude of program pulse 1655 by $\Delta V2$.

As mentioned, in between the program pulses are verify pulses, e.g., three verify pulses, which are used in a verify operation. In some embodiments, there can be a verify pulse for each state that data is being programmed into, e.g., state A, B and C. In other embodiments, there can be more or fewer verify pulses. The verify pulses in each set can have amplitudes of Vva, Vvb and Vvc (FIG. 9) or Vvb' (FIG. 10a), for instance. Example verify pulses 1606 follow the program pulse 1605.

FIG. 16b depicts voltages applied to unselected word lines in a program operation, including a step-up in pass voltage applied to WLn−1 and WLn+1. The time scale in FIG. 16b corresponds to that in FIG. 16a. Vpass-low can be applied to unselected word lines which are adjacent to a selected word line when Vpgm is relatively low, such as during the first program phase 1601, while Vpass-high is applied to the adjacent word lines when Vpgm is relatively high, such as during the second program phase 1602. In this example, Vpass-low is applied while the program pulses at t1-11 are applied, and Vpass-high is applied while program pulses at t12-15 are applied. Waveforms (not shown) with an amplitude of Vpass, the nominal pass voltage, are applied to the non-adjacent unselected word lines when each program pulse is applied to the selected word line. Moreover, when the verify voltages are applied to the selected word line, read pass voltages (Vread) are applied to the unselected word lines. Waveform 1676 is an example waveform whose amplitude is Vpass-low, waveform 1678 is an example waveform whose amplitude is Vpass-high, and waveform 1677 is an example waveform whose amplitude is Vread. 0 V may be applied to WLn−1 and WLn+1 between the pass voltages.

The first pass voltage 1678 of the second phase, Vpass-high, is stepped up from the last pass voltage 1677 from the first phase, Vpass-low, by $\Delta$Vpass. Generally, the corresponding step down in Vpgm, $\Delta V2$, will be a function of $\Delta$Vpass. When the pass voltage on an adjacent word line/control gate is increased by $\Delta$Vpass, part of the voltage change capacitively couples to the floating gate of the adjacent word line, and from there to the floating gate of the selected word line. Moreover, part of the voltage change couples directly from the control gate of the adjacent word line to the floating gate of the selected word line. See FIG. 16c.

If the program pulse did not step down to offset or compensate for the capacitive coupling caused by the step up in the pass voltage on the adjacent word lines, the apparent program voltage would be higher than the applied voltage, possibly leading to widening of threshold voltage distributions. This is true because the increase in voltage on the floating gate of a selected storage element which is caused by the step up in Vpass is equivalent to what would be seen by applying a sharply higher Vpgm with a fixed Vpass. $\Delta V2$ should not be too large or it would result in over compensating for the step up in Vpass, thereby slowing down programming unnecessarily. If $\Delta V2$ is too low, it will not sufficiently compensate for the step up in Vpass.

It is also possible to have three or more program phases, with two or more step increases in Vpass which are accompanied by respective step downs in program voltage.

Figure 16C:
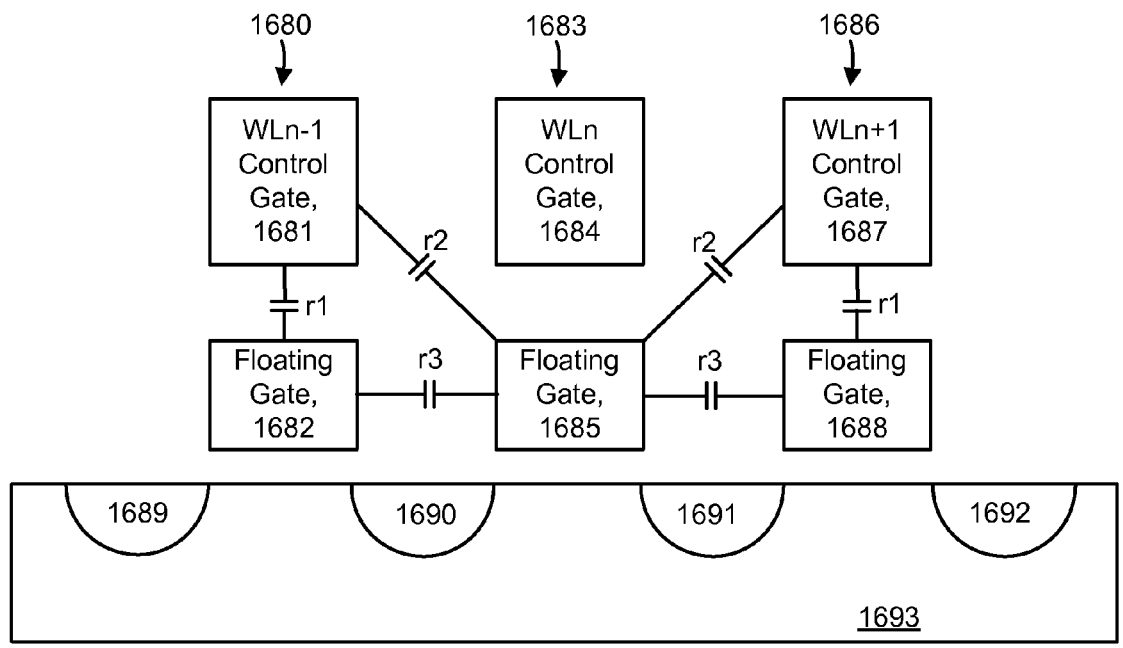
FIG. 16c depicts capacitive coupling to the floating gate of a storage element during programming due to a stepped up Vpass on adjacent storage elements.

FIG. 16c depicts capacitive coupling to the floating gate of a storage element during programming due to a stepped up Vpass on adjacent storage elements. A substrate 1693 includes source/drain regions 1689, 1690, 1691 and 1692. Storage elements 1680, 1683 and 1686 are formed on the substrate. Storage element 1680 includes a WLn−1 control gate 1681 and a floating gate 1682. Storage element 1683 includes a WLn control gate 1684 and a floating gate 1685. Storage element 1686 includes a WLn+1 control gate 1687 and a floating gate 1688. Storage element 1683 is being programmed and receives Vpgm via WLn, while storage elements 1680 and 1686 receive a stepped up pass voltage of Vpass-high. When Vpass-high is applied to the control gates 1681 and 1687, corresponding to time t12 in FIGS. 16a and b, a portion of the potential is capacitively coupled to the floating gates 1682 and 1688, respectively, according to a capacitive coupling ratio r1. Moreover, a portion of the potential which is capacitively coupled to the floating gates 1682 and 1688 is in turn capacitively coupled to the floating gate 1685 according to a capacitive coupling ratio r3. Moreover, a portion of the potential on the control gates 1681 and 1687 is capacitively coupled to the floating gate 1685 according to a capacitive coupling ratio r2.

The total amount of capacitive coupling (CC) experienced by the floating gate 1685 due to the adjacent storage elements is about CC=$\alpha \times \Delta$Vpass, where $\alpha$=2×(r1×r3+r2). The values of r1, r2 and r3 depend on the specific memory device configuration. Note that due to symmetry, the coupling from the storage elements 1680 and 1686 is the same. If an asymmetric design was used, different amounts of coupling would be seen. The total amount of coupling from one adjacent word line may be about 15%, or about 10-20%, so that the total amount of coupling from both adjacent word lines WLn−1 and WLn+1 is about 30%, or about 20-40%. As smaller memory device dimensions are realized, the coupling will increase to say, 20-50%, 20-60% or more. The coupling is higher for memory devices with smaller dimensions due to the reduced distances between the storage elements. Thus, to offset the capacitive coupling on the floating gate of a selected storage element due to the initial application of Vpass-high on the adjacent word lines, in one possible approach, $\Delta V2$ is less than $\Delta$Vpass, such as by about 0.20 to about 0.50 of $\Delta$Vpass. As a specific example, assume Vpass-low=3 V and Vpass-high=9 V, so that $\Delta$Vpass=6 V. With (x=0.30, $\Delta V2$=$\alpha \times \Delta$Vpass=0.30×6 V=1.8 V, so that the amplitude of program pulse 1660 is 1.8 V less than the amplitude of program pulse 1655 (FIG. 16a).

Figure 17:
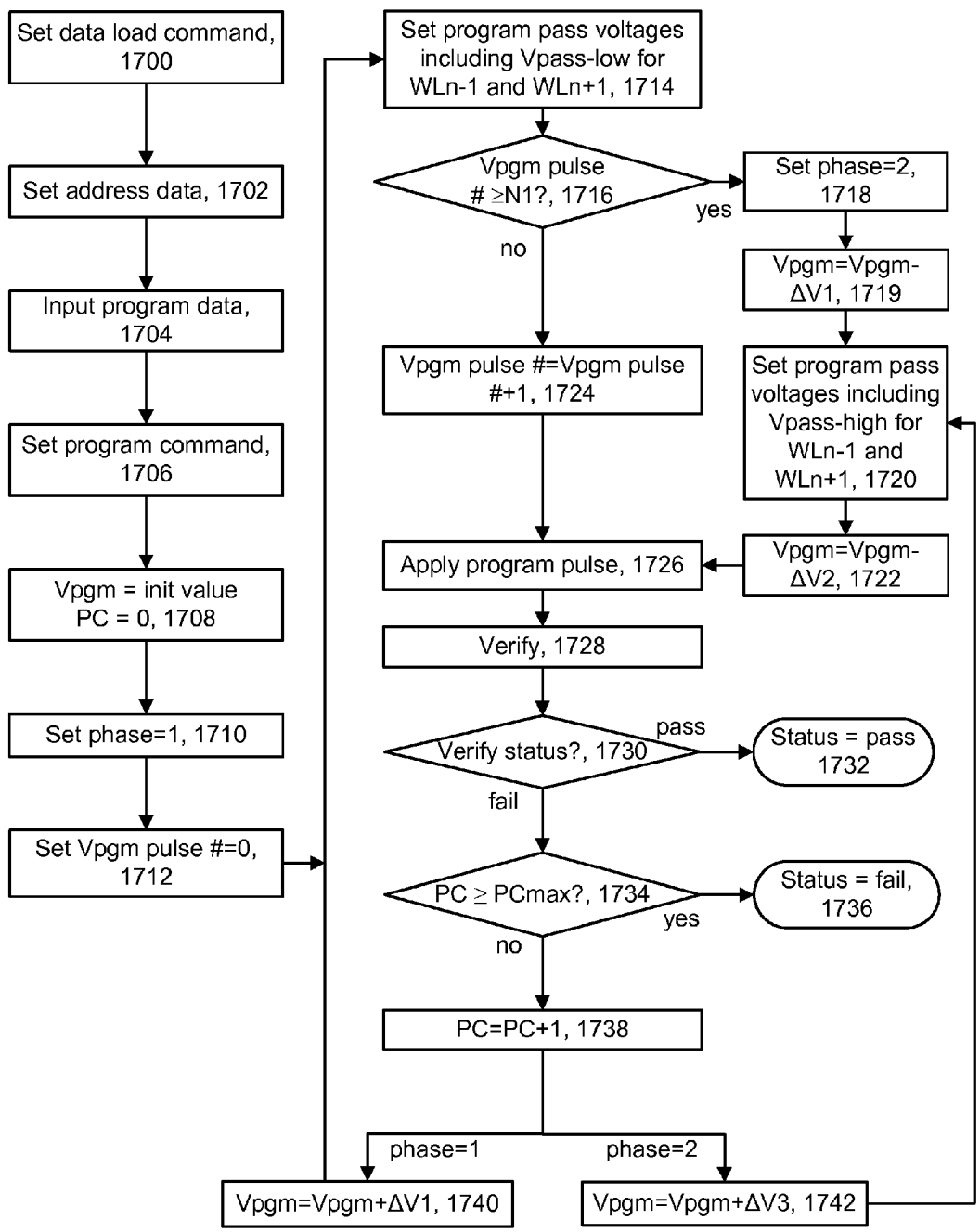
FIG. 17 is a flow chart describing one embodiment of a method for programming non-volatile memory, where a switchover to a higher pass voltage is based on a program pulse number.

FIG. 17 is a flow chart describing one embodiment of a method for programming non-volatile memory, where a switchover to a higher pass voltage is based on a program pulse number. In one implementation, storage elements are erased (in blocks or other units) prior to programming. In step 1700, a "data load" command is issued by the controller and input received by control circuitry 510. In step 1702, address data designating the page address is input to decoder 514 from the controller or host. In step 1704, a page of program data for the addressed page is input to a data buffer for programming. That data is latched in the appropriate set of latches. In step 1706, a "program" command is issued by the controller to state machine 512.

Triggered by the "program" command, the data latched in step 1704 will be programmed into the selected storage elements controlled by state machine 512 using the stepped program pulses of the pulse train 1600 of FIG. 16a applied to the appropriate selected word line. In step 1708, the program voltage, Vpgm, is initialized to an initial value (e.g., 12 V or other value) and a program counter (PC) maintained by state machine 512 is initialized at zero. In step 1710, program phase=1 is set, indicating that the program operation is in a first phase. In step 1712, a program pulse number is initialized to zero. The number of program pulses which are applied will be tracked so that Vpass-high can be used when a predetermined number (N1) of program pulses have been applied. In step 1714, the programming pass voltages are set for the unselected word lines, including Vpass-low for the adjacent word lines WLn−1 and WLn+1, and a nominal Vpass for the non-adjacent unselected word lines. At decision step 1716, a determination is made as to whether the current program pulse number equals or exceeds N1. If the current program pulse number does not equal or exceed N1, the program pulse number is incremented at step 1724, and a program pulse is applied to the selected word line, at step 1726.

Thus, the first program pulse is applied to the selected word line to begin programming storage elements associated with the selected word line. If logic "0" is stored in a particular data latch indicating that the corresponding storage element should be programmed, then the corresponding bit line is grounded. On the other hand, if logic "1" is stored in the particular latch indicating that the corresponding storage element should remain in its current data state, then the corresponding bit line is connected to 1.5-3 V to inhibit programming.

In step 1728, the states of the selected storage elements are verified in a verify operation. If it is detected that the target threshold voltage of a selected storage element has reached the appropriate level, then the data stored in the corresponding data latch is changed to a logic "1." If it is detected that the threshold voltage has not reached the appropriate level, the data stored in the corresponding data latch is not changed. In this manner, a bit line having a logic "1" stored in its corresponding data latch does not need to be programmed. When all of the data latches are storing logic "1," the state machine (via the wired-OR type mechanism described above) knows that all selected storage elements have been programmed. In step 1730, a check is made as to whether all of the data latches are storing logic "1." If all of the data latches are storing logic "1," the programming process is complete and successful because all selected storage elements were programmed and verified. A status of "PASS" is reported in step 1732. In some embodiments, the programming process is considered complete and successful even if not all selected storage elements were verified as being programmed. In such a case, errors during subsequent read operations can occur due to insufficiently programmed storage elements. However, these errors can be corrected by ECC.

If, in step 1730, it is determined that not all of the data latches are storing logic "1," then the programming process continues. In some embodiments, the program process stops even if not all of the data latches are storing logic "1." In decision step 1734, the program counter PC is checked against a program limit value PCmax. One example of a program limit value is twenty; however, other numbers can also be used. If the program counter PC is greater than or equal to PCmax, then the program operation has failed, and a status of "FAIL" is reported in step 1736. If the program counter PC is less than PCmax, then step 1738 is performed, in which the program counter PC is incremented by one. If phase=1, indicating that the program operation is in the first phase, then Vpgm is increased by a step size $\Delta V1$ at step 1740, and the process loops back to step 1714 for a next program-verify iteration of the program operation.

At decision step 1716, once N1 program pulses have been applied in the program operation, the second phase is initiated at step 1718 by setting phase=2. At step 1719, the Vpgm increment of $\Delta V1$ which was added at step 1740 is removed. At step 1720, the programming pass voltages are set for the unselected word lines, including Vpass-high for the adjacent word lines WLn−1 and WLn+1, and a nominal Vpass for the non-adjacent unselected word lines. Thus, there is a step up from Vpass-low to Vpass-high. Moreover, at step 1722, the program pulse amplitude Vpgm is decremented or stepped down by V2. Processing then proceeds as discussed at step 1726. After step 1738, with phase=2, Vpgm is incremented by $\Delta V3$ at step 1742 and processing continues at step 1720. As mentioned, $\Delta V3$ can be equal to, or different than $\Delta V1$.

Figure 18:
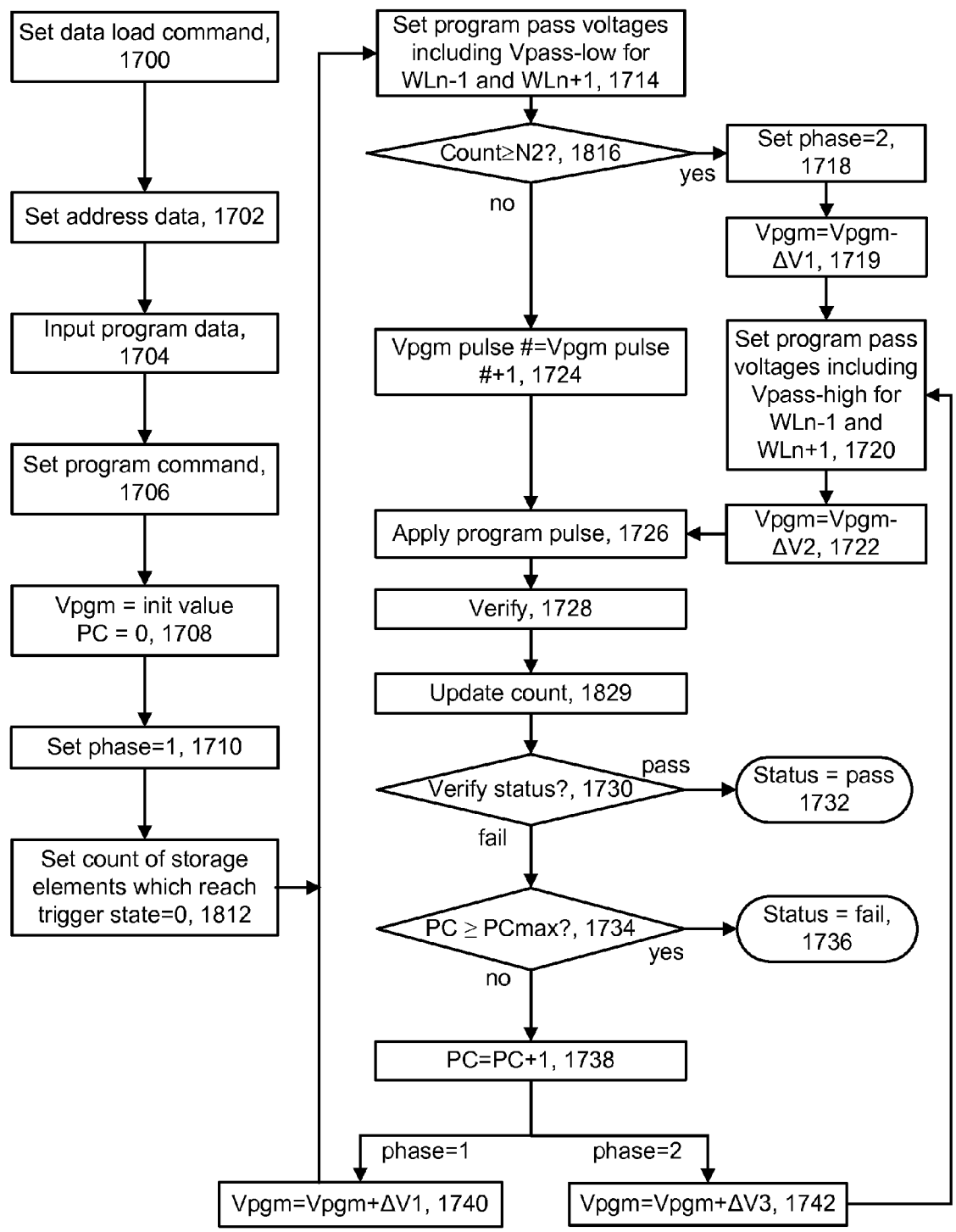
FIG. 18 is a flow chart describing another embodiment of a method for programming non-volatile memory, where a switchover to a higher pass voltage is based on a number of storage elements reaching a trigger state.

FIG. 18 is a flow chart describing another embodiment of a method for programming non-volatile memory, where a switchover to a higher pass voltage is based on a number of storage elements reaching a trigger state.

Triggering a switchover to a higher Vpass by tracking storage elements is an adaptive approach which accounts for various performance changes which can occur over time in a memory device. For example, as a memory device accumulates more program-erase cycles, the storage elements may program faster, e.g., with fewer program pulses, so that the switchover occurs sooner. Moreover, different memory devices, or different blocks of storage elements in a memory array, or even different word lines, can program at different speeds. An adaptive switchover automatically accounts for such variations.

For example, with a four-state memory devices having states E, A, B and C, the switchover may occur when the storage elements which are intended to be programmed to states A and B have completed programming and are locked out. For instance, the storage elements which are intended to be programmed to state B can be tracked. Similarly, for example, for an eight-state memory device, with states E, A, B, C, D, E, F and G, the storage elements which are intended to be programmed to states E or F can be tracked. The procedure may be adapted accordingly to more than eight states, such as sixteen or more data states.

Like-numbered steps correspond to those in FIG. 17. Step 1812 includes setting a count of storage elements which reach a trigger state to zero. After setting the pass voltages at step 1714, at decision step 1816, a determination is made as to whether the count equals or exceeds a number N2. Generally, the target data states for the storage elements in communication with a selected word line will be uniformly distributed. For example, with four data states, about one-fourth of the storage elements will remain in the E state, about one-fourth will be programmed to the A state, about one-fourth will be programmed to the B state, and about one-fourth will be programmed to the C state. This, if state B is the trigger state, and Vvb is the corresponding target verify level, the number of storage elements which are expected to reach the B state is known. N2 can represent any desired portion of the trigger state storage elements. Moreover, to trigger a switch to Vpass-high sooner in the program operation, N2 can represent a smaller portion, e.g., 10-20% of the trigger state storage elements. Similarly, to trigger a switch to Vpass-high later in the program operation, N2 should represent a larger portion, e.g., 80-90% of the trigger state storage elements.

As mentioned, it is also possible to use a trigger verify level which is not associated with a data state as a trigger to switch to phase 2. For example, see Vt in FIG. 8. This provides additional flexibility in determining when the second program phase starts.

If the count has reach N2 at decision step 1816, phase=2 is set at step 1718, and the process proceeds as discussed in connection with FIG. 17. If the count has not exceeded N2, the program pulse number is incremented at step 1724, and the process proceeds as discussed in connection with FIG. 17.

After the verify operation, at step 1728, the count is updated at step 1829 based on the number of additional storage elements which were verified to reach the trigger verify level, and the process proceeds as discussed in connection with FIG. 17.

In one embodiment of the technology described herein, a method for operating non-volatile storage includes applying a first set of program pulses with incrementally increasing amplitudes to selected non-volatile storage elements in a set of non-volatile storage elements, where the set of non-volatile storage elements is in communication with a set of word lines, and the first set of program pulses are applied to the selected non-volatile storage elements via a selected word line of the set of word lines. When each program pulse of the first set of program pulses is applied to the selected word line, the method further includes applying a pass voltage whose amplitude is at a first level to at least one adjacent unselected word line which is adjacent to the selected word line. The method further includes determining when a condition is met for changing the amplitude of the pass voltage. When the condition is met, the method further includes applying a second set of program pulses with incrementally increasing amplitudes to the selected word line, where an amplitude of a first program pulse of the second set of program pulses is reduced relative to an amplitude of a last program pulse of the first set of program pulses. When each program pulse of the second set of program pulses is applied to the selected word line, the method further includes applying a pass voltage whose amplitude is at a second level, higher than the first level, to the at least one adjacent unselected word line.

In another embodiment, a non-volatile storage system includes a set of non-volatile storage elements, a set of word lines in communication with the set of non-volatile storage elements, including a selected word line in communication with selected non-volatile storage elements of the set of non-volatile storage elements, and at least one control circuit in communication with the set of word lines. The at least one control circuit applies a first set of program pulses with incrementally increasing amplitudes to the selected word line. When each program pulse of the first set of program pulses is applied to the selected word line, the at least one control circuit applies a pass voltage whose amplitude is at a first level to at least one adjacent unselected word line which is adjacent to the selected word line, and determines when a condition is met for changing the amplitude of the pass voltage. When the condition is met, the at least one control circuit applies a second set of program pulses with incrementally increasing amplitudes to the selected word line, where an amplitude of a first program pulse of the second set of program pulses is reduced relative to an amplitude of a last program pulse of the first set of program pulses. When each program pulse of the second set of program pulses is applied to the selected word line, the at least one control circuit applies a pass voltage whose amplitude is at a second level, higher than the first level, to the at least one adjacent unselected word line.

In another embodiment, a method for operating a non-volatile storage system includes applying a first set of program pulses with incrementally increasing amplitudes to a selected word line in a set of word lines, where the set of word lines is in communication with a set of non-volatile storage elements. When each program pulse of the first set of program pulses is applied to the selected word line, the method further includes applying a pass voltage whose amplitude is at a first level to adjacent unselected word lines which are adjacent to the selected word line, and applying a pass voltage whose amplitude is at a higher, second level to non-adjacent unselected word lines which are not adjacent to the selected word line. The method further includes determining when a condition is met for changing the amplitude of the pass voltage. When the condition is met, the method further includes applying a second set of program pulses with incrementally increasing amplitudes to the selected word line, where an amplitude of a first program pulse of the second set of program pulses is reduced relative to an amplitude of a last program pulse of the first set of program pulses. When each program pulse of the second set of program pulses is applied to the selected word line, the method further includes applying a pass voltage whose amplitude is at a third level, higher than the first level, to the adjacent unselected word lines.

Corresponding methods, systems and computer- or processor-readable storage devices for performing the methods provided herein are provided.

The foregoing detailed description has been presented for purposes of illustration and description. It is not intended to be exhaustive or limited to the precise form disclosed. Many modifications and variations are possible in light of the above teaching. The described embodiments were chosen in order to best explain the principles of the technology and its practical application, to thereby enable others skilled in the art to best utilize the technology in various embodiments and with various modifications as are suited to the particular use contemplated. It is intended that the scope of the technology be defined by the claims appended hereto.

What is claimed is:

1. A method for operating a non-volatile storage system, comprising:

applying a first plurality of program pulses with incrementally increasing amplitudes to selected non-volatile storage elements in a set of non-volatile storage elements, the set of non-volatile storage elements is in communication with a set of word lines, and the first plurality of program pulses are applied to the selected non-volatile storage elements via a selected word line of the set of word lines;

when each program pulse of the first plurality of program pulses is applied to the selected word line, applying a pass voltage whose amplitude is at a first level to at least one adjacent unselected word line which is adjacent to the selected word line;

determining when a condition is met for changing the amplitude of the pass voltage;

when the condition is met, applying a second plurality of program pulses with incrementally increasing amplitudes to the selected word line, an amplitude of a first program pulse of the second plurality of program pulses is reduced relative to an amplitude of a last program pulse of the first plurality of program pulses; and when each program pulse of the second plurality of program pulses is applied to the selected word line, applying a pass voltage whose amplitude is at a second level, higher than the first level, to the at least one adjacent unselected word line.

2. The method of claim 1, wherein:

the condition is met when a predetermined number of program pulses are applied to the selected word line.

3. The method of claim 1, wherein:
a difference between the amplitude of the first program pulse of the second plurality of program pulses and the amplitude of the last program pulse of the first plurality of program pulses is set based on a difference between the first and second levels of the pass voltage.

4. The method of claim 1, wherein:
the first and second plurality of program pulses are part of a common program operation.

5. The method of claim 1, wherein:
the first plurality of program pulses have incrementally increasing amplitudes according to a first step size, and the second plurality of program pulses have incrementally increasing amplitudes according to a second step size, greater than the first step size.

6. The method of claim 1, wherein:
when each program pulse of the first plurality of program pulses is applied to the selected word line, the pass voltage whose amplitude is at the first level is applied to two adjacent word lines of the selected word line; and
when each program pulse of the second plurality of program pulses is applied to the selected word line, the pass voltage whose amplitude is at the second level is applied to the two adjacent word lines of the selected word line.

7. The method of claim 1, wherein:
the condition is met when the first plurality of program pulses cause a threshold voltage of at least a first non-volatile storage element of the selected non-volatile storage elements to exceed a verify level.

8. The method of claim 7, wherein:
the set of non-volatile storage elements stores data according to one erased state and three programmed data states; and
the verify level is associated with a second highest data state of the programmed data states.

9. The method of claim 7, wherein:
the set of non-volatile storage elements stores data according to one erased state and seven programmed data states; and
the verify level is associated with a second or third highest data state of the programmed data states.

10. The method of claim 1, further comprising:
when each program pulse of the second plurality of program pulses is applied to the selected word line, applying a pass voltage whose amplitude is between the first and second levels to non-adjacent unselected word lines which are not adjacent to the selected word line.

11. A non-volatile storage system, comprising:
a set of non-volatile storage elements;
a set of word lines in communication with the set of non-volatile storage elements, including a selected word line in communication with selected non-volatile storage elements of the set of non-volatile storage elements; and
at least one control circuit in communication with the set of word lines, the at least one control circuit applies a first plurality of program pulses with incrementally increasing amplitudes to the selected word line, when each program pulse of the first plurality of program pulses is applied to the selected word line, applies a pass voltage whose amplitude is at a first level to at least one adjacent unselected word line which is adjacent to the selected word line, determines when a condition is met for changing the amplitude of the pass voltage, when the condition is met, applies a second plurality of program pulses with incrementally increasing amplitudes to the selected word line, an amplitude of a first program pulse of the second plurality of program pulses is reduced relative to an amplitude of a last program pulse of the first plurality of program pulses, and when each program pulse of the second plurality of program pulses is applied to the selected word line, applies a pass voltage whose amplitude is at a second level, higher than the first level, to the at least one adjacent unselected word line.

12. The non-volatile storage system of claim 11, wherein:
the condition is met when a predetermined number of program pulses are applied to the selected word line.

13. The non-volatile storage system of claim 11, wherein:
the pass voltage whose amplitude is at the first level is applied to two adjacent word lines of the selected word line when each program pulse of the first plurality of program pulses is applied to the selected word line; and
the pass voltage whose amplitude is at the second level is applied to the two adjacent word lines of the selected word line when each program pulse of the second plurality of program pulses is applied to the selected word line; and
a difference between the amplitude of the first program pulse of the second plurality of program pulses and the amplitude of the last program pulse of the first plurality of program pulses is set based on a difference between the first and second levels of the pass voltage.

14. The non-volatile storage system of claim 11, wherein:
the condition is met when the first plurality of program pulses cause a threshold voltage of at least a first non-volatile storage element of the selected non-volatile storage elements to exceed a specified verify level of a plurality of available verify levels.

15. The non-volatile storage system of claim 11, wherein:
when each program pulse of the second plurality of program pulses is applied to the selected word line, the at least one control circuit applies a pass voltage whose amplitude is at a third level, lower than the second level and higher than the first level, to non-adjacent unselected word lines which are not adjacent to the selected word line.

16. A method for operating a non-volatile storage system, comprising:
applying a first plurality of program pulses with incrementally increasing amplitudes to a selected word line in a set of word lines, the set of word lines is in communication with a set of non-volatile storage elements;
when each program pulse of the first plurality of program pulses is applied to the selected word line, applying a pass voltage whose amplitude is at a first level to adjacent unselected word lines which are adjacent to the selected word line, and applying a pass voltage whose amplitude is at a higher, second level to non-adjacent unselected word lines which are not adjacent to the selected word line;
determining when a condition is met for changing the amplitude of the pass voltage applied to the adjacent unselected word lines;
when the condition is met, applying a second plurality of program pulses with incrementally increasing amplitudes to the selected word line, an amplitude of a first program pulse of the second plurality of program pulses is reduced relative to an amplitude of a last program pulse of the first plurality of program pulses; and
when each program pulse of the second plurality of program pulses is applied to the selected word line, applying a pass voltage whose amplitude is at a third level, higher than the first level, to the adjacent unselected word lines.

17. The method of claim 16, further comprising:

when each program pulse of the second plurality of program pulses is applied to the selected word line, applying a pass voltage whose amplitude is between the first and third levels to the non-adjacent unselected word lines.

18. The method of claim 16, wherein:

the third level is higher than the second level.

19. The method of claim 16, wherein:

a difference between the amplitude of the first program pulse of the second plurality of program pulses and the amplitude of the last program pulse of the first plurality of program pulses is set based on a difference between the first and third levels of the pass voltage.

20. The method of claim 16, wherein:

the set of non-volatile storage elements stores data according to one erased state and multiple programmed data states; and the condition is met when the first plurality of program pulses cause a threshold voltage of at least a first non-volatile storage element of the selected non-volatile storage elements to exceed a verify level which is associated with second or third highest data state of the programmed data states.

* * * * *